US011227661B2

(12) United States Patent
Hong

(10) Patent No.: US 11,227,661 B2
(45) Date of Patent: Jan. 18, 2022

(54) SEMICONDUCTOR MEMORY DEVICE, AN ERASED PAGE SEARCH CONTROLLER, STORAGE DEVICE HAVING THE SAME, AND OPERATING METHOD THEREOF

(71) Applicant: SK hynix Inc., Gyeonggi-do (KR)

(72) Inventor: Jiman Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 78 days.

(21) Appl. No.: 16/508,074

(22) Filed: Jul. 10, 2019

(65) Prior Publication Data
US 2020/0202951 A1    Jun. 25, 2020

(30) Foreign Application Priority Data
Dec. 19, 2018    (KR) .................. 10-2018-0165483

(51) Int. Cl.
*G06F 12/00*    (2006.01)
*G11C 16/26*    (2006.01)
*G11C 7/10*    (2006.01)
*G11C 5/14*    (2006.01)
*G11C 16/08*    (2006.01)

(52) U.S. Cl.
CPC .............. *G11C 16/26* (2013.01); *G11C 5/147* (2013.01); *G11C 7/1045* (2013.01); *G11C 7/1069* (2013.01); *G11C 16/08* (2013.01)

(58) Field of Classification Search
CPC ....... G11C 16/26; G11C 7/1045; G11C 5/147; G11C 7/1069; G11C 16/08; G11C 16/3431; G11C 11/5642; G11C 16/24; G11C 16/10; G11C 16/16; G11C 16/30

USPC ......................................................... 711/207
See application file for complete search history.

(56) References Cited

U.S. PATENT DOCUMENTS

| | | | | |
|---|---|---|---|---|
| 7,685,380 | B1* | 3/2010 | Khu ................... | G06F 12/0246 711/156 |
| 2013/0246730 | A1* | 9/2013 | Yamano ............. | G06F 12/0246 711/166 |
| 2016/0329084 | A1* | 11/2016 | Han .................... | G11C 11/5621 |
| 2017/0329703 | A1* | 11/2017 | Lo ....................... | G06F 12/0246 |

FOREIGN PATENT DOCUMENTS

| KR | 10-0891406 | 4/2009 |
|---|---|---|
| KR | 10-2017-0006976 | 1/2017 |
| KR | 10-2017-0130657 | 11/2017 |

* cited by examiner

*Primary Examiner* — Mardochee Chery
(74) *Attorney, Agent, or Firm* — IP & T Group LLP

(57) ABSTRACT

A controller controls an operation of a semiconductor memory device. The controller includes an erased page search controller, a command generator, and a data receiver. The erased page search controller determines a search mode of the semiconductor memory device, selects a page to search for, among a plurality of pages, based on the search mode, and generates a search control signal corresponding to a selected page. The command generator generates a search read command for the selected page based on the search control signal. The data receiver receives, from the semiconductor memory device, search read data corresponding to the search read command. The search read command is a command for controlling the semiconductor memory device to perform a read operation by applying a read voltage to multiple word lines including a word line corresponding to the selected page.

20 Claims, 22 Drawing Sheets

SEMICONDUCTOR MEMORY DEVICE, AN ERASED PAGE SEARCH CONTROLLER, STORAGE DEVICE HAVING THE SAME, AND OPERATING METHOD THEREOF

CROSS-REFERENCE TO RELATED APPLICATION

The present application claims priority under 35 U.S.C. § 119(a) to Korean patent application number 10-2018-0165483 filed on Dec. 19, 2018, the entire disclosure of which is herein incorporated by reference in its entirety.

BACKGROUND

Field of Invention

Various embodiments relate generally to an electronic device, and more particularly, to a semiconductor memory device, a controller, a storage device having the same, and an operating method thereof.

Description of Related Art

A semiconductor memory device may have a two-dimensional structure in which strings are arranged in a horizontal direction with respect to a semiconductor substrate, or a three-dimensional structure in which strings are arranged in a vertical direction with respect to a semiconductor substrate. Three-dimensional semiconductor memory devices are devised to overcome the limited degree of integration in two-dimensional semiconductor memory devices. A three-dimensionally structured semiconductor memory device may include a plurality of memory cells vertically stacked on a semiconductor substrate. A controller may control operations of the semiconductor memory device. The semiconductor memory device and the controller may constitute a storage device.

SUMMARY

Various embodiments of the present disclosure provide a semiconductor memory device capable of avoiding performance degradation caused by read disturb, a controller and a storage device having the same.

Various embodiments of the present disclosure provide a semiconductor memory device capable of avoiding performance degradation caused by read disturb and a method of operating a controller.

According to an embodiment, a controller may control an operation of a semiconductor memory device. The controller may include an erased page search controller, a command generator, and a data receiver. The erased page search controller may determine a search mode of the semiconductor memory device, select a page to search for, among a plurality of pages, based on the search mode, and generate a search control signal corresponding to a selected page. The command generator may generate a search read command for the selected page based on the search control signal. The data receiver may receive, from the semiconductor memory device, search read data corresponding to the search read command. The search read command may be a command for controlling the semiconductor memory device to perform a read operation by applying a read voltage to multiple word lines including a word line corresponding to the selected page.

The data receiver may transfer the search read data to the erased page search controller. The erased page search controller may determine whether the selected page is an initially erased page on the basis of the search read data.

The initially erased page may be an erased page that serves as a boundary between a program state and an erase state among a plurality of pages in a selected memory block.

The erased page search controller may change the page to search for and generate a search control signal corresponding to the changed page when the selected page is not the initially erased page.

The erased page search controller may change the page to search for by a binary search method.

The erased page search controller may change the page to search for by a linear search method.

The controller may further include a general operation controller. The general operation controller may receive a request from a host and generate a general control signal corresponding to the request. The command generator may generate a general operation command to control a general operation of the semiconductor memory device based on the general control signal.

According to another embodiment, a semiconductor memory device may include a memory cell array, a peripheral circuit, and a control logic. The memory cell array may include a plurality of memory blocks. The peripheral circuit may perform a search read operation on the memory cell array. The control logic may control the peripheral circuit to perform the search read operation on a selected memory block of the memory cell array based on a search read command received from a controller. During the search read operation, the peripheral circuit may perform a read operation by applying a read voltage to multiple word lines, among a plurality of word lines coupled to the selected memory block, and applying a pass voltage to remaining word lines among the plurality of word lines.

The selected memory block may include first to n-th pages. The first to n-th pages are programmed starting from the first page, and pages with smaller numbers are programmed before pages with large numbers, where n is a natural number greater than one.

When the control logic receives the search read command for an i-th page, the control logic may control the peripheral circuit to perform a read operation by applying the pass voltage to word lines coupled to first to (i−1)-th pages and applying the read voltage to word lines coupled to the i-th to n-th pages, where i is a natural number greater than one and equal to or less than n.

The control logic may control the peripheral circuit to perform a general read operation on the memory cell array in response to receiving a general read command. During the general read operation, the peripheral circuit may perform a read operation by applying the read voltage to a selected word line, among the plurality of word lines coupled to a selected memory block, and applying the pass voltage to unselected word lines, among the plurality of word lines.

The selected memory block may include first to n-th pages. When the control logic receives the general read command for an i-th page, the control logic may control the peripheral circuit to perform the read operation by applying the pass voltage to word lines coupled to first to (i−1)-th pages and (i+1)-th to n-th pages and applying the read voltage to a word line coupled to the i-th page, where n is a natural number greater than one, and i is a natural number greater than one and equal to or less than n.

According to another embodiment, a storage device may include a semiconductor memory device including a plurality of memory blocks, and a controller including a controller controlling an operation of the semiconductor memory device. The controller may transfer a search read command corresponding to a first selected page in a selected memory block, among the plurality of memory blocks, to the semiconductor memory device in response to a search mode. The semiconductor memory device may perform a search read operation by applying a read voltage to at least two word lines including a word line corresponding to the first selected page, among a plurality of word lines coupled to the selected memory block, in response to the search read command.

The semiconductor memory device may transfer search read data corresponding to a result of the search read operation to the controller. The controller may determine whether the first selected page is an initially erased page based on the search read data.

The controller may transfer a search read command corresponding to a second selected page in the selected memory block to the semiconductor memory device when it is determined that the first selected page is not the initially erased page.

The controller may determine the first selected page and the second selected page by a binary search method.

The controller may determine the first selected page and the second selected page by a linear search method.

According to an embodiment, an operation of a semiconductor memory device may be controlled by a method of operating a controller. By the operating method, a search mode of the semiconductor memory device may be determined, and an initially erased page for a selected memory block of the semiconductor memory device may be searched for by using the search read command. The search read command may be a command for controlling the semiconductor memory device to perform a read operation by applying a read voltage to multiple word lines including a word line corresponding to a selected page.

The searching for the initially erased page may include transferring a search read command corresponding to the selected page, among a plurality of pages in the selected memory block, to the semiconductor memory device, receiving search read data corresponding to the search read command from the semiconductor memory device, and determining whether the selected page and subsequent pages are erased pages on the basis of the search read data.

The determining of whether the selected page and the subsequent pages are the erased pages on the basis of the search read data may comprise determining the selected page and the subsequent pages as the erased pages when the search read data indicate data corresponding to an erase state.

The determining of whether the selected page and the subsequent pages are the erased pages on the basis of the search read data may comprise determining at least one of the selected page and the subsequent pages as a programmed page when the search read data include data corresponding to a program state.

According to another embodiment, by a method of operating a semiconductor memory device having a memory block including a plurality of pages, a search read command for a selected page, among the plurality of pages, may be received, word lines corresponding to the selected page and subsequent pages may be selected from among a plurality of word lines coupled to the memory block in response to reception of the search read command, a read voltage may be applied to selected word lines, a pass voltage may be applied to unselected word lines, among the plurality of word lines, and a bit line sensing operation may be performed on a plurality of bit lines coupled to the memory block.

The method may further include outputting data generated as a result of the bit line sensing operation as search read data. The search read data may indicate whether at least one of the selected page and the subsequent pages is a programmed page.

According to another embodiment, a storage device may include a memory device and a controller. The memory device may include a plurality of memory blocks, and a plurality of word lines coupled to a memory block selected from among the plurality of memory blocks. The controller may be configured to transfer a search read command to the semiconductor memory device. The memory device, in response to the search read command, may apply a read voltage that is lower than a pass voltage to a target word line and at least one subsequent word line subsequent to the target word line, among the plurality of word lines, and apply the pass voltage to at least one preceding word line preceding the target word line, among the plurality of word lines.

DETAILED DESCRIPTION

Figure 1:
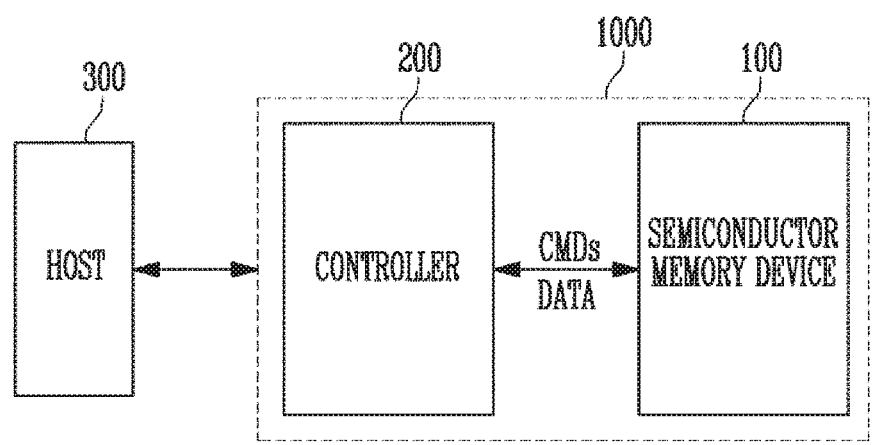
FIG. 1 is a block diagram illustrating a storage device including a controller and a semiconductor memory device according to an embodiment.

Hereinafter, advantages and features of the present disclosure and methods for achieving them will be made clear from embodiments described below in detail with reference to the accompanying drawings. However, they may be embodied in different forms and should not be construed as limited to the embodiments set forth herein. Rather, these embodiments are provided so that this disclosure will be thorough and complete, and will fully convey the scope of the example embodiments to those skilled in the art.

It is noted that reference to "an embodiment," "another embodiment" or the like does not necessarily mean only one embodiment, and different references to any such phrase are not necessarily to the same embodiment(s).

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

It will be understood that when an element is referred to as being "coupled" or "connected" to a certain element, it may be directly coupled or connected to the certain element or may be indirectly coupled or connected to the certain element, with intervening elements being present therebetween. In the specification, when an element is referred to as "comprising" or "including" a component, it does not exclude other components but may further include other components unless a description to the contrary is specifically pointed out in context.

Hereinafter, preferred embodiments of the invention will be described in detail with reference to the accompanying drawings. In the drawings, like reference numerals refer to like elements throughout. In some embodiments, well-known processes, device structures, and technologies will not be described in detail to avoid ambiguousness of the present disclosure. This intends to disclose the gist of the present disclosure more clearly by omitting unnecessary description FIG. 1 is a block diagram illustrating a storage device 1000 including a controller 200 and a semiconductor memory device 100 according to an embodiment of the present disclosure.

Referring to FIG. 1, the storage device 1000 may include the semiconductor memory device 100 and the controller 200. The storage device 1000 may communicate with a host 300. The controller 200 may control general operations of the semiconductor memory device 100 by transferring commands CMDs on the basis of requests received from the host 300. The controller 200 may transfer data DATA corresponding to each of the commands CMDs to the semiconductor memory device 100, or may receive the data DATA from the semiconductor memory device 100. When the controller 200 receives a program request and program data from the host 300, the controller 200 may transfer a program command and program data corresponding thereto to the semiconductor memory device 100. When the controller 200 receives a read request from the host 300, the controller 200 may transfer a read command corresponding to the read request to the semiconductor memory device 100. The semiconductor memory device 100 may transfer read data corresponding to the read command to the controller 200.

The read command for a read operation may be transferred to the semiconductor memory device 100 from the controller 200. The semiconductor memory device 100 may read data in response to the read command. The read data may be transferred from the semiconductor memory device 100 to the controller 200.

The program data for a program operation may be transferred to the semiconductor memory device 100 from the controller 200. The program data may be stored in a page buffer of the semiconductor memory device 100. The page buffer may be included in a read and write circuit of the semiconductor memory device 100. The read and write circuit and the page buffer will be described below with reference to FIG. 2. Memory cells in the semiconductor memory device 100 may be programmed on the basis of the program data stored in the page buffer of the semiconductor memory device 100.

A situation where power supply is abruptly blocked or interrupted while the controller 200 is controlling the program operation of the semiconductor memory device 100, i.e., a sudden power off (SPO) may occur. For example, the sudden power off (SPO) may occur when a predetermined memory block in the semiconductor memory device 100 is programmed with data by a program command generated by the controller 200.

When power is supplied again after the above sudden power off occurs, i.e., when power is on, the controller 200 may recognize that the sudden power off has occurred and may resume the program operation of the semiconductor memory device 100 which was being performed before the sudden power off occurred. For example, the controller 200 may resume the program operation on the memory block of the semiconductor memory device 100 to program the memory block with the data which was programmed before the sudden power off occurred.

More specifically, to resume the program operation of the semiconductor memory device 100 which was interrupted due to the sudden power off, the controller 200 may enter a search mode after power is on and may perform a search operation on a plurality of memory blocks in the semiconductor memory device 100 prior to resuming the corresponding program operation.

The search operation may be performed to check a state of the program operation which was performed before the sudden power off occurred. In other words, the search operation may be able to detect how many of a plurality of data (not shown) input to the semiconductor memory device 100 are actually programmed into a memory block.

The controller 200 may check a program state or an erase state of each of the pages in the memory block. More specifically, in order to identify an erased page that serves as a boundary between program state and an erase state among a plurality of pages included in a memory block, the controller 200 may perform a read operation on at least one of the physical pages among the plurality of pages included in the memory block. For example, the erased page that is at a boundary may mean that pages preceding the erased page are in a program state and pages subsequent to the erased page are in an erase state. In this description, the erased page that is at a boundary between program state and an erase state may be referred to as an "initially erased page."

For example, the controller 200 may control the semiconductor memory device 100 to perform a read operation on a first page in the memory block. When data read as a result of the read operation includes program data, the corresponding page may be determined as a programmed page. However, when the data read as the result of the read operation includes only erase data, the corresponding page may be determined as an erased page.

According to an embodiment of the present disclosure, the controller 200 may use a search read operation distinct from a general read operation so as to search for an initially erased page, among pages in a memory block. In the search read operation, a read voltage may be applied to a plurality of word lines coupled to a plurality of pages including a selected page at the same time. Therefore, despite repetitive read operations, read disturb may be suppressed. As a result, the performance of the semiconductor memory device 100 and the storage device 1000 having the same may be improved. The search read operation may be described in detail with reference to FIGS. 7 to 16.

Figure 2:
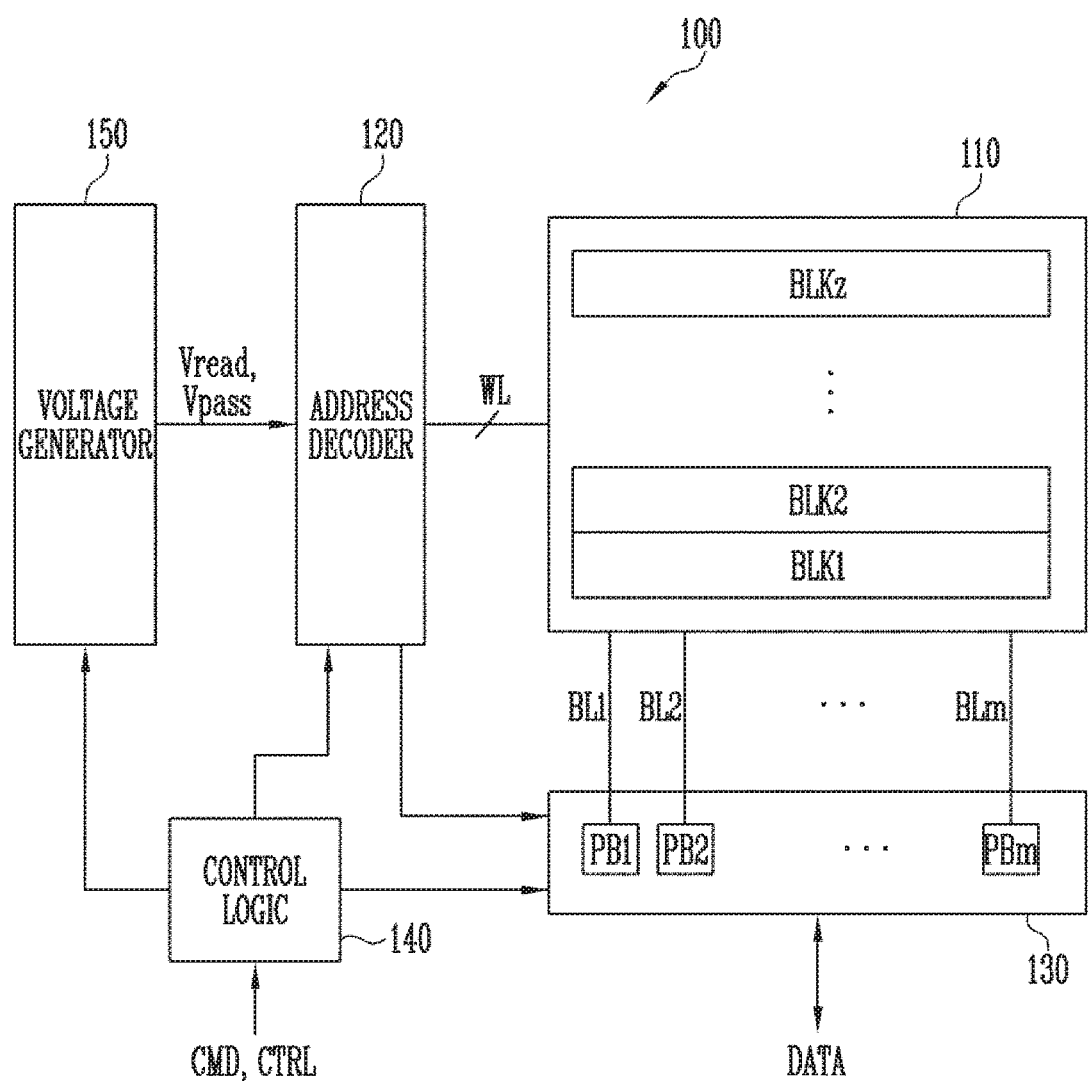
FIG. 2 is a block diagram illustrating a semiconductor memory device shown in FIG. 1.

FIG. 2 is a block diagram illustrating the semiconductor memory device 100 shown in FIG. 1.

Referring to FIG. 2, the semiconductor memory device 100 may include a memory cell array 110, an address decoder 120, a read and write circuit 130, a control logic 140, and a voltage generator 150.

The memory cell array 110 may include a plurality of memory blocks BLK1 to BLKz. The plurality of memory blocks BLK1 to BLKz may be coupled to the address decoder 120 through word lines WL. The plurality of memory blocks BLK1 to BLKz may be coupled to the read and write circuit 130 through bit lines BL1 to BLm. Each of the plurality of memory blocks BLK1 to BLKz may include a plurality of memory cells. According to an embodiment, the plurality of memory cells may be non-volatile memory cells having a vertical channel structure. The memory cell array 110 may have a two-dimensional structure. Alternatively, the memory cell array 110 may have a three-dimensional structure.

Each of the plurality of memory cells in the memory cell array 110 may store data of at least 1-bit. According to an embodiment, each of the plurality of memory cells in the memory cell array 110 may be a single-level cell (SLC) storing 1-bit data. According to another embodiment, each of the plurality of memory cells in the memory cell array 110 may be a multi-level cell (MLC) storing 2-bit data. According to another embodiment, each of the plurality of memory cells in the memory cell array 110 may be a triple-level cell (TLC) storing 3-bit data. According to another embodiment, each of the plurality of memory cells in the memory cell array 110 may be a quad-level cell (QLC) storing 4-bit data. According to another embodiment, each of the plurality of memory cells in the memory cell array 110 may store 5 or more bits of data.

The address decoder 120, the read and write circuit 130, the control logic 140 and the voltage generator 150 may operate as a peripheral circuit for driving the memory cell array 110. The address decoder 120 may be coupled to the memory cell array 110 through the word lines WL. The address decoder 120 may operate in response to control of the control logic 140. The address decoder 120 may receive an address through an input/output buffer (not illustrated) in the semiconductor memory device 100.

The address decoder 120 may be configured to decode a block address of the received address. The address decoder 120 may select at least one memory block according to the decoded block address. During a read voltage applying operation in the general read operation, the address decoder 120 may apply a read voltage Vread to a selected word line of a selected memory block and a pass voltage Vpass to unselected word lines. During a program verify operation, a verify voltage may be applied to the selected word line of the selected memory block and the pass voltage Vpass may be applied to the unselected word lines. The read voltage Vread, the pass voltage Vpass, the verify voltage and the pass voltage Vpass may be generated by the voltage generator 150.

During a search read operation, the address decoder 120 may apply the read voltage Vread to a plurality of selected word lines in the selected memory block and the pass voltage Vpass to the remaining word lines.

The address decoder 120 may be configured to decode a column address of the received address. The address decoder 120 may transfer the decoded column address to the read and write circuit 130.

A read operation and a program operation of the semiconductor memory device 100 may be performed in units of pages. An address received at the request of a read operation and a program operation may include a block address, a row address, and a column address. The address decoder 120 may select one memory block and one word line in response to the block address and the row address. The column address may be decoded by the address decoder 120 and provided to the read and write circuit 130.

The address decoder 120 may include a block decoder, a row decoder, a column decoder, and an address buffer.

The read and write circuit 130 may include a plurality of page buffers PB1 to PBm. The read and write circuit 130 may operate as a "read circuit" during a general read operation of the memory cell array 110 and as a "write circuit" during a write operation. The page buffers PB1 to PBm may be coupled to the memory cell array 110 through the bit lines BL1 to BLm. During the general read operation and the program verify operation, the plurality of page buffers PB1 to PBm may continuously supply a sensing current to the bit lines coupled to the memory cells to sense threshold voltages of the memory cells. Further, the plurality of page buffers PB1 to PBm may sense changes in amount of current flowing according to program states of corresponding memory cells through a sensing node, and latch the changes as sensing data. The read and write circuit 130 may operate in response to page buffer control signals output from the control logic 140.

The read and write circuit 130 may temporarily store read data by sensing data of a memory cell and output the data DATA to the input/output buffer (not shown) of the semiconductor memory device 100 during a read operation. According to an exemplary embodiment, the read and write circuit 130 may include a column selection circuit in addition to the page buffers PB1 to PBm (or page registers).

The control logic 140 may be coupled to the address decoder 120, the read and write circuit 130, and the voltage generator 150. The control logic 140 may receive a command CMD and a control signal CTRL through the input/output buffer (not illustrated) of the semiconductor memory device 100. The control logic 140 may be configured to control general operations of the semiconductor memory device 100 in response to the control signal CTRL. In addition, the control logic 140 may output a control signal to control sensing node precharge potential levels of the page buffers PB1 to PBm. The control logic 140 may control the read and write circuit 130 to perform a read operation of the memory cell array 110.

The voltage generator 150 may generate the read voltage Vread and the pass voltage Vpass in response to a control signal output from the control logic 140 during a read operation. The voltage generator 150 may include a plurality of pumping capacitors receiving an internal power voltage to generate a plurality of voltages having various voltage levels. Further, the voltage generator 150 may selectively activate the plurality of pumping capacitors to generate the plurality of voltages in response to control of the control logic 140. As described above, the voltage generator 150 may include a charge pump, which may include the above-described pumping capacitors. The specific configuration of the charge pump in the voltage generator 150 may be designed in various manners.

The address decoder 120, the read and write circuit 130, and the voltage generator 150 may function as a peripheral circuit configured to perform a read operation, a write operation, and an erase operation on the memory cell array 110. The control logic 140 may control the peripheral circuit to perform the read operation, the write operation, and the erase operation on the memory cell array 110.

When the command CMD received from the controller 200 is a general read command, the control logic 140 may control the peripheral circuit to perform a general read operation. When the command CMD received from the controller 200 is a search read command, the control logic 140 may control the peripheral circuit to perform a search read operation.

According to an embodiment of the present disclosure, during a search read operation, the semiconductor memory device 100 may apply a read voltage to a plurality of word lines including a word line coupled to a selected page and may apply a pass voltage to the remaining word lines. Therefore, since the read voltage having a lower voltage level than the pass voltage is applied to the plurality of word lines, performance degradation of the semiconductor memory device 100 caused by read disturb may be prevented.

Figure 3:
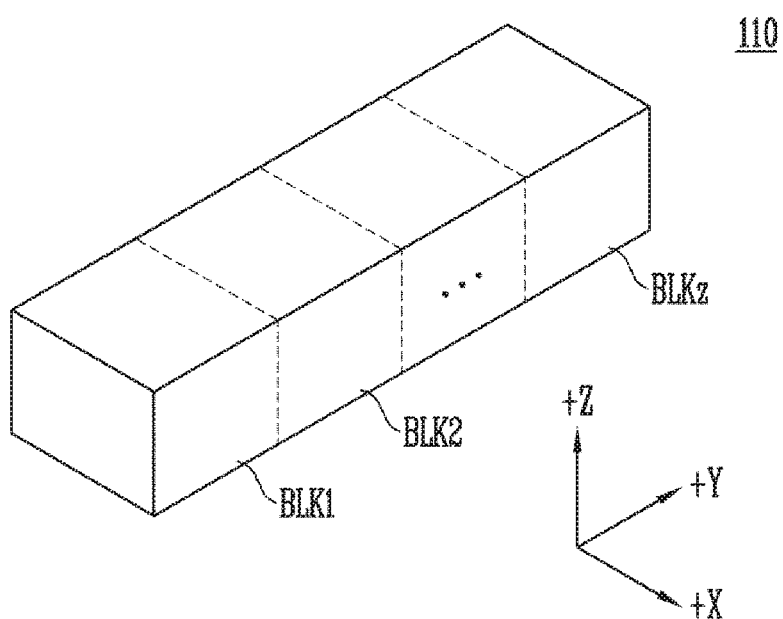
FIG. 3 is a diagram illustrating an example of a memory cell array shown in FIG. 2.

FIG. 3 is a diagram illustrating an example of the memory cell array 110 shown in FIG. 2.

Referring to FIG. 3, the memory cell array 110 may include the plurality of memory blocks BLK1 to BLKz. Each of the memory blocks BLK1 to BLKz may include a three-dimensional structure. Each memory block may include a plurality of memory cells stacked over a substrate. The plurality of memory cells may be arranged in +X direction, +Y direction and +Z direction. The structure of each memory block will be described in detail below with reference to FIGS. 4 and 5.

Figure 4:
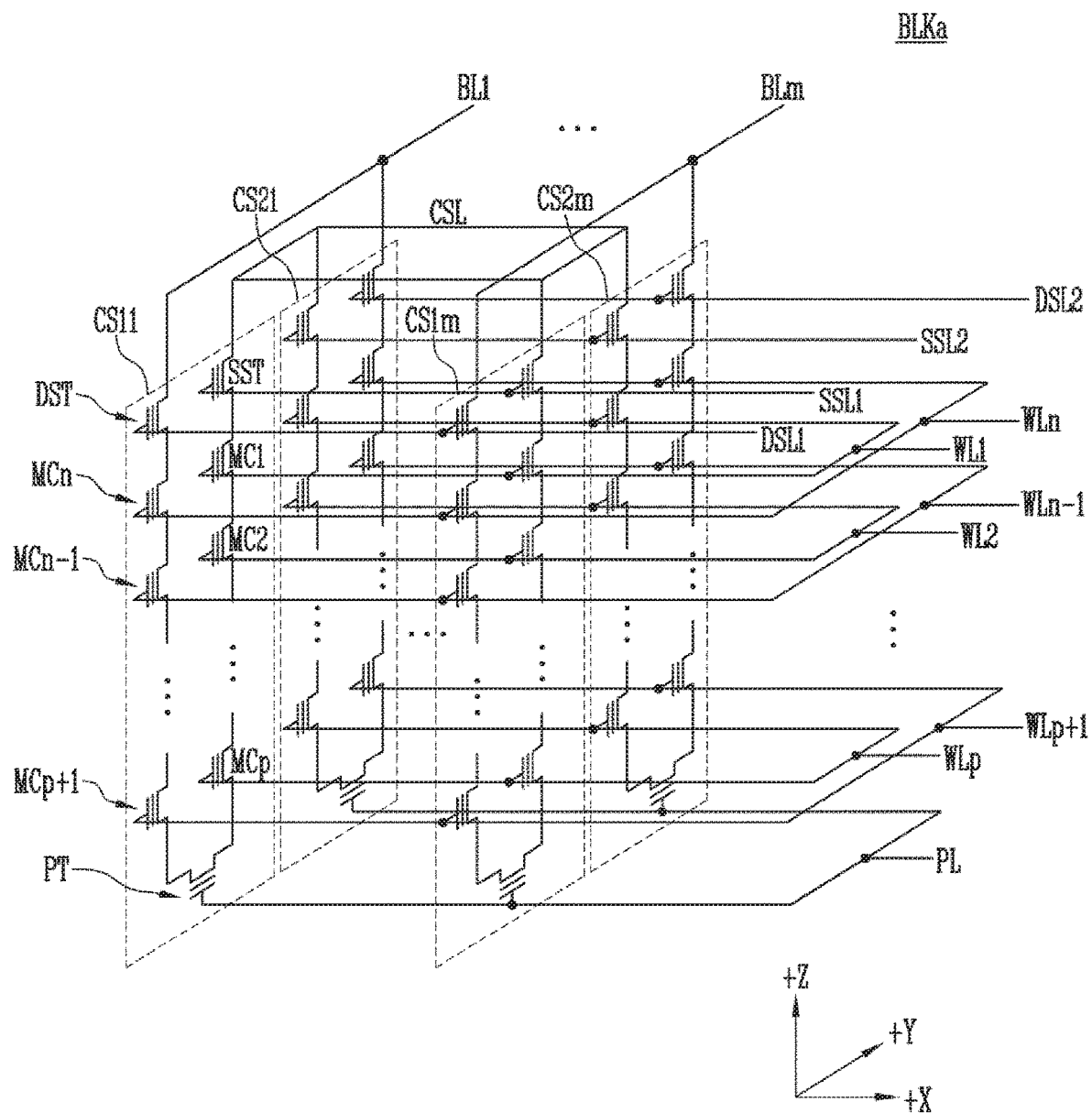
FIG. 4 is a circuit diagram illustrating a memory block BLKa among a plurality of memory blocks BLK1 to BLKz shown in FIG. 3.

FIG. 4 is a circuit diagram illustrating a memory block BLKa among a plurality of memory blocks BLK1 to BLKz shown in FIG. 3.

Referring to FIG. 4, the memory block BLKa may include a plurality of cell strings CS11 to CS1m and CS21 to CS2m. According to an embodiment, each of the cell strings CS11 to CS1m and CS21 to CS2m may be formed in a U shape. In the memory block BLKa, 'm' cell strings may be arranged in a row direction (i.e., +X direction). FIG. 4 illustrates two cell strings arranged in a column direction (i.e., +Y direction). However, it is understood that three or more cell strings may be arranged in the column direction.

Each of the cell strings CS11 to CS1m and CS21 to CS2m may include at least one source select transistor SST, first to n-th memory cells MC1 to MCn, a pipe transistor PT, and at least one drain select transistor DST.

Each of the select transistors SST and DST and each of the memory cells MC1 to MCn may have similar structures to each other. According to an embodiment, each of the select transistors SST and DST and the memory cells MC1 to MCn may include a channel layer, a tunneling insulating layer, a charge storage layer, and a blocking insulating layer. According to an embodiment, a pillar for providing a channel layer may be provided in each cell string. According to an embodiment, a pillar for providing at least one of the channel layer, the tunneling insulating layer, the charge storage layer, and the blocking insulating layer may be provided to each cell string.

The source select transistor SST of each cell string may be coupled between a common source line CSL and the first to pth memory cells MC1 to MCp.

According to an embodiment, source select transistors of cell strings arranged in the same row may be coupled to a source select line extending in a row direction, and source select transistors of cell strings arranged in different rows may be coupled to different source select lines. In FIG. 4, source select transistors of the cell strings CS11 to CS1m in the first row may be coupled to a first source select line SSL1. Source select transistors of the cell strings CS21 to CS2m in the second row may be coupled to a second source select line 55L2.

According to another embodiment, the source select transistors of the cell strings CS11 to CS1m and CS21 to CS2m may be coupled in common to one source select line.

The first to n-th memory cells MC1 to MCn of each cell string may be coupled between the source select transistor SST and the drain select transistor DST.

The first to n-th memory cells MC1 to MCn may be divided into the first to pth memory cells MC1 to MCp and (p+1)-th to n-th memory cells MCp+1 to MCn. The first to pth memory cells MC1 to MCp may be sequentially arranged in a reverse direction to the +Z direction and may be coupled in series between the source select transistor SST and the pipe transistor PT. The (p+1)-th to n-th memory cells MCp+1 to MCn may be sequentially arranged in the +Z direction and may be coupled in series between the pipe transistor PT and the drain select transistor DST. The first to pth memory cells MC1 to MCp and the (p+1)-th to n-th memory cells MCp+1 to MCn may be coupled through the pipe transistor PT. Gates of the first to n-th memory cells MC1 to MCn of each cell string may be coupled to first to n-th word lines WL1 to WLn, respectively.

A gate of the pipe transistor PT of each cell string may be coupled to a pipe line PL.

The drain select transistor DST of each cell string may be coupled between a corresponding bit line and the memory cells MCp+1 to MCn. Cell strings arranged in the row direction may be coupled to a drain select line extending in the row direction. Drain select transistors of the cell strings CS11 to CS1m in the first row may be coupled to a first drain select line DSL1. Drain select transistors of the cell strings CS21 to CS2m in the second row may be coupled to a second drain select line DSL2.

Cell strings arranged in the column direction may be coupled to a bit line extending in the column direction. In FIG. 4, the cell strings CS11 and CS21 in the first column may be coupled to the first bit line BL1. The cell strings CS1m and CS2m in an mth column may be coupled to the mth bit line BLm.

Memory cells coupled to the same word line arranged in cell strings arranged in the row direction may form a single page. For example, memory cells coupled to the first word line WL1 in the cell strings CS11 to CS1m in the first row may constitute a single page. Memory cells coupled to the first word line WL1 in the cell strings CS21 to CS2m in the second row may constitute another page. When one of the first and second drain select lines DSL1 and DSL2 is selected, cell strings arranged in one row direction may be selected. When one of the first to n-th word lines WL1 to WLn is selected, one page may be selected from the selected cell strings.

In another embodiment, even bit lines and odd bit lines may be provided instead of the first to mth bit lines BL1 to BLm. Even cell strings of the cell strings CS11 to CS1m or CS21 to CS2m arranged in the row direction may be coupled to the even bit lines, respectively. Odd cell strings of the cell strings CS11 to CS1m or CS21 to CS2m arranged in the row direction may be coupled to the odd bit lines, respectively.

According to an embodiment, at least one of the first to n-th memory cells MC1 to MCn may serve as a dummy memory cell. For example, one or more dummy memory cells may be provided to reduce an electric field between the source select transistor SST and the first to pth memory cells MC1 to MCp. Alternatively, one or more dummy memory cells may be provided to reduce an electric field between the drain select transistor DST and the memory cells MCp+1 to MCn. When more dummy memory cells are provided, the operational reliability of the memory block BLKa may be improved, whereas the size of the memory block BLKa may be increased. When fewer dummy memory cells are provided, the size of the memory block BLKa may be reduced, and the operational reliability of the memory block BLKa may also be reduced.

In order to efficiently control one or more dummy memory cells, each of the dummy memory cells may have a required threshold voltage. Before or after an erase operation on the memory block BLKa, program operations may be performed on a portion or entirety of the dummy memory cells. When an erase operation is performed after a program operation is performed, the dummy memory cells may have required threshold voltages by controlling a voltage applied to dummy word lines coupled to the dummy memory cells.

Figure 5:
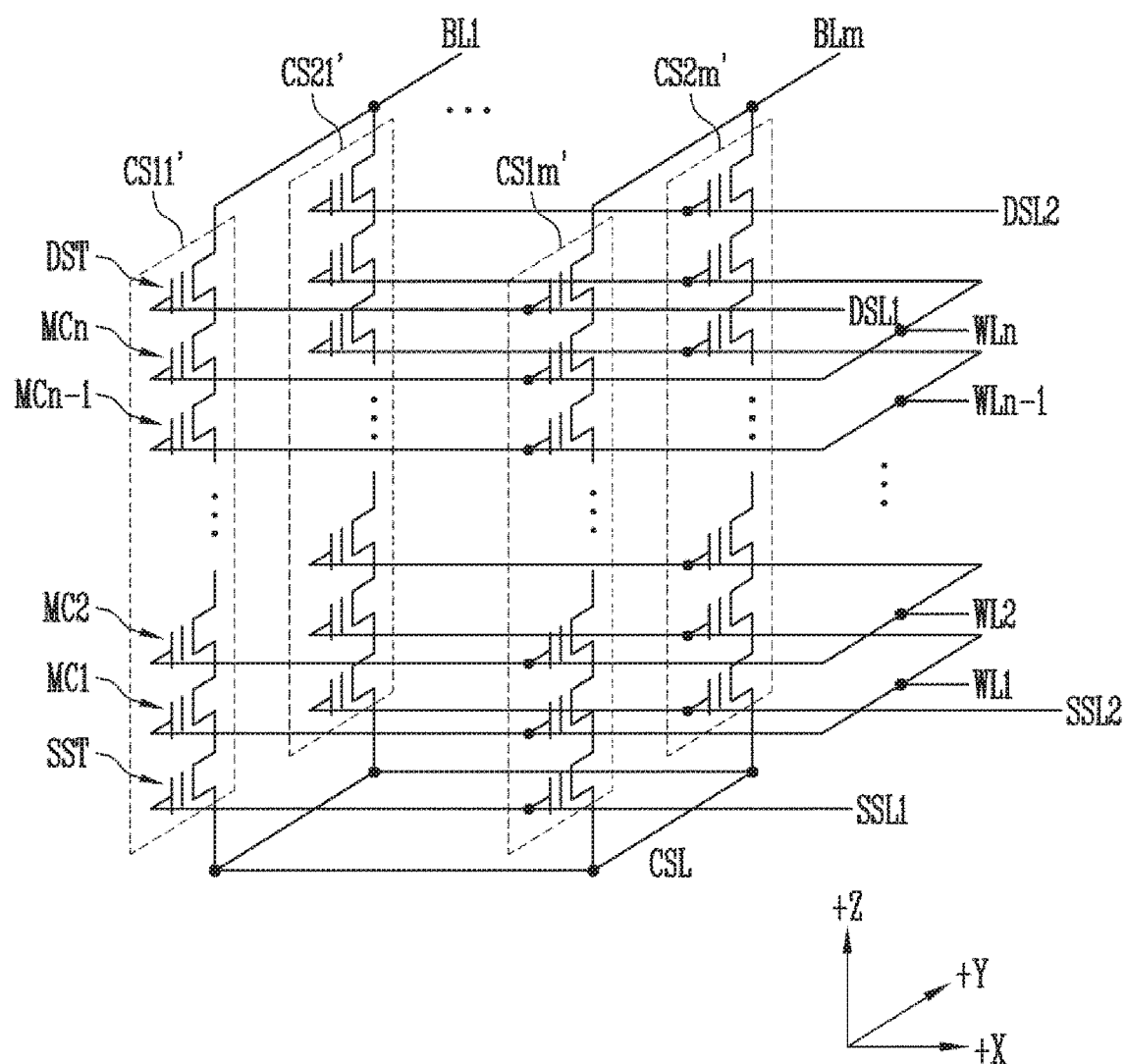
FIG. 5 is a circuit diagram illustrating a memory block BLKb among a plurality of memory blocks BLK1 to BLKz shown in FIG. 3.

FIG. 5 is a circuit diagram illustrating a memory block BLKb among a plurality of memory blocks BLK1 to BLKz shown in FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' may extend in the +Z direction. Each of the plurality of cell strings CS11' to CS1m' and CS21' to CS2m' may include at least one source select transistor SST, the first to n-th memory cells MC1 to MCn, and at least one drain select transistor DST which are stacked on a substrate (not shown) under a memory block BLKb.

The source select transistor SST of each cell string may be coupled between the common source line CSL and the first to nth memory cells MC1 to MCn. Source select transistors of cell strings arranged in the same row may be coupled to the same source select line. Source select transistors of the cell strings CS11' to CS1m' arranged in the first row may be coupled to the first source select line SSL1. Source select transistors of the cell strings CS21' to CS2m' arranged in the second row may be coupled to the second source select line SSL2. According to another embodiment, the source select transistors of the cell strings CS11' to CS1m and CS21' to CS2m' may be commonly coupled to a single source select line.

The first to n-th memory cells MC1 to MCn of each cell string may be coupled in series between the source select transistor SST and the drain select transistor DST. Gates of the first to n-th memory cells MC1 to MCn may be coupled to the first to n-th word lines WL1 to WLn, respectively.

The drain select transistor DST of each cell string may be coupled between the corresponding bit line and the memory cells MC1 to MCn. Drain select transistors of cell strings arranged in a row direction may be coupled to a drain select line extending in the row direction. Drain select transistors of the cell strings CS11' to CS1m' in the first row may be coupled to the first drain select line DSL1. Drain select transistors of the cell strings CS21' to CS2m' in the second row may be coupled to the second drain select line DSL2.

As a result, the memory block BLKb shown in FIG. 5 may have a similar equivalent circuit to the memory block BLKa shown in FIG. 4 except that the pipe transistor PT is removed from each cell string of the memory block BLKa.

In another embodiment, even bit lines and odd bit lines may be provided instead of the first to mth bit lines BL1 to BLm. Even cell strings of the cell strings CS11' to CS1m' or CS21' to CS2m' arranged in the row direction may be coupled to the even bit lines, respectively. Odd cell strings of the cell strings CS11' to CS1m' or CS21' to CS2m' arranged in the row direction may be coupled to the odd bit lines, respectively.

According to an embodiment, at least one of the first to n-th memory cells MC1 to MCn may serve as a dummy memory cell. For example, one or more dummy memory cells may be provided to reduce an electric field between the source select transistor SST and the first to n-th memory cells MC1 to MCn. Alternatively, one or more dummy memory cells may be provided to reduce an electric field between the drain select transistor DST and the memory cells MC1 to MCn. When more dummy memory cells are provided, the operational reliability of the memory block BLKb may be improved, whereas the size of the memory block BLKb may be increased. When fewer memory cells are provided, the size of the memory block BLKb may be reduced and the operational reliability of the memory block BLKb may be degraded.

In order to efficiently control one or more dummy memory cells, each of the dummy memory cells may have a required threshold voltage. Before or after an erase operation on the memory block BLKb, program operations may be performed on a portion or entirety of the dummy memory cells. When an erase operation is performed after a program operation is performed, the dummy memory cells may have required threshold voltages by controlling a voltage applied to dummy word lines coupled to the dummy memory cells.

Figure 6:
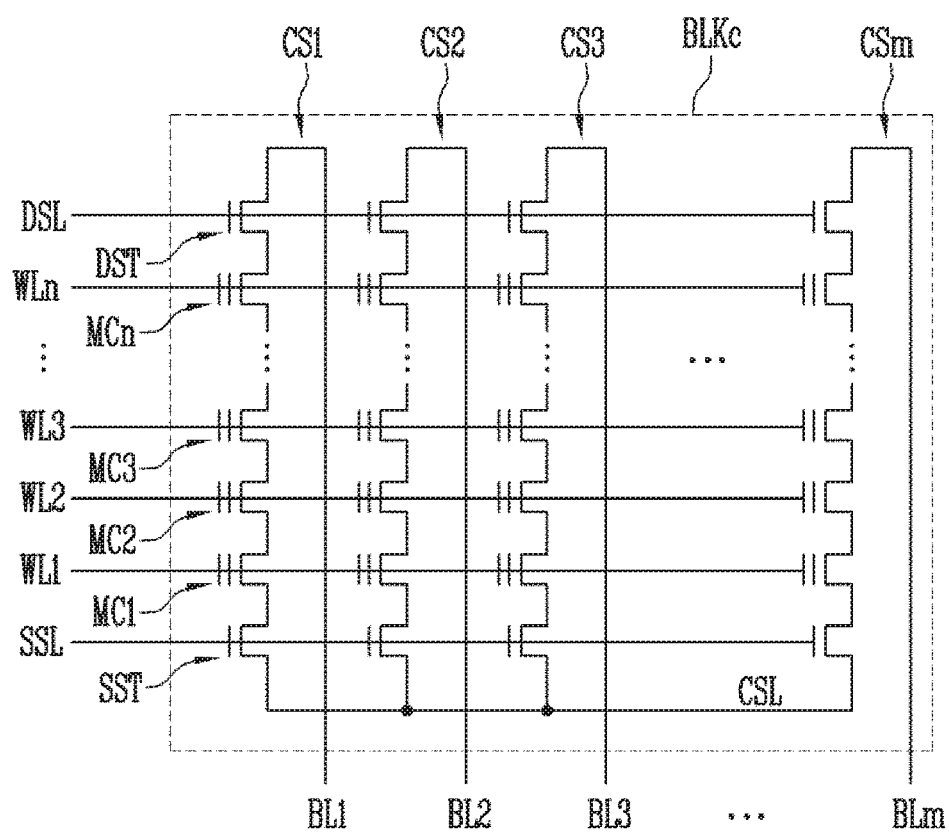
FIG. 6 is a circuit diagram illustrating a memory block BLKc among a plurality of memory blocks BLK1 to BLKz in a memory cell array 110 shown in FIG. 2.

FIG. 6 is a circuit diagram illustrating a memory block BLKc among a plurality of memory blocks BLK1 to BLKz in the memory cell array 110 shown in FIG. 2.

Referring to FIG. 6, the memory block BLKc may include a plurality of cell strings CS1 to CSm. The plurality of cell strings CS1 to CSm may be coupled to the plurality of bit lines BL1 to BLm, respectively. Each of the cell strings CS1 to CSm may include at least one source select transistor SST, the first to n-th memory cells MC1 to MCn, and at least one drain select transistor DST.

Each of the select transistors SST and DST and each of the memory cells MC1 to MCn may have similar structures to each other. According to an embodiment, each of the select transistors SST and DST and the memory cells MC1 to MCn may include a channel layer, a tunneling insulating layer, a charge storage layer, and a blocking insulating layer. According to an embodiment, a pillar for providing a channel layer may be provided in each cell string. According to an embodiment, a pillar for providing at least one of the channel layer, the tunneling insulating layer, the charge storage layer, and the blocking insulating layer may be provided to each cell string.

The source select transistor SST of each cell string may be coupled between the common source line CSL and the first to n-th memory cells MC1 to MCn.

The first to n-th memory cells MC1 to MCn of each cell string may be coupled between the source select transistor SST and the drain select transistor DST.

The drain select transistor DST of each cell string may be coupled between a corresponding bit line and the memory cells MC1 to MCn.

Memory cells coupled to the same word line may form a single page. When the drain select line DSL is selected, the cell strings CS1 to CSm may be selected. When one of the word lines WL1 to WLn is selected, one page may be selected from selected cell strings.

In another embodiment, even bit lines and odd bit lines may be provided instead of the first to mth bit lines BL1 to BLm. Even cell strings of the cell strings CS1 to CSm may be coupled to the even bit lines, respectively. Odd cell strings thereof may be coupled to the odd bit lines, respectively.

Figure 7:
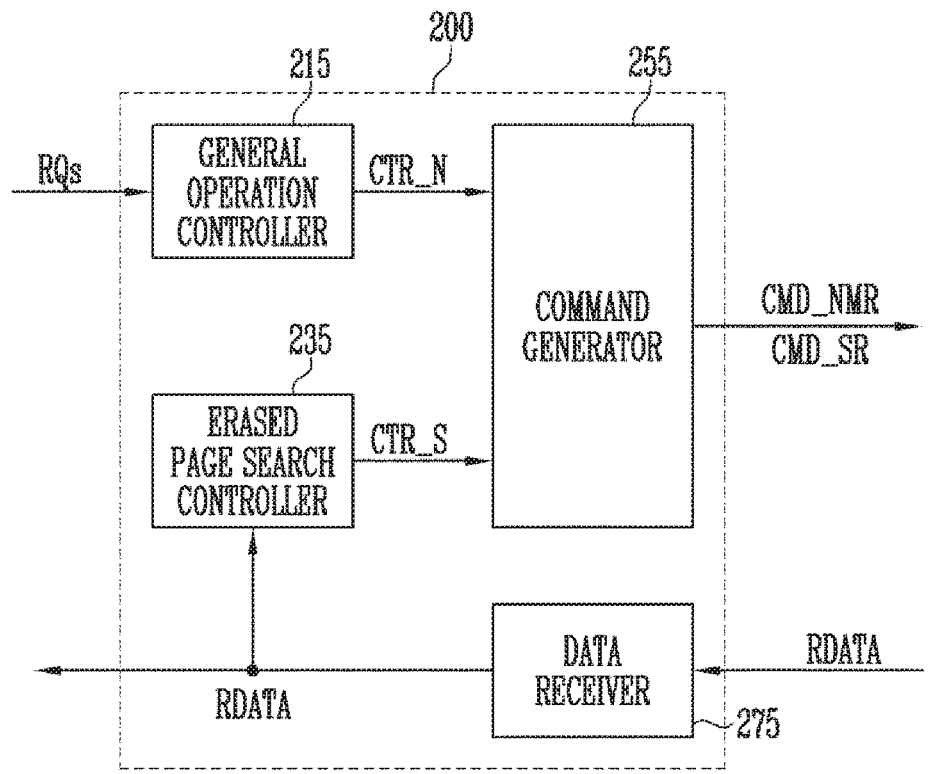
FIG. 7 is a block diagram illustrating a controller according to an embodiment of the present disclosure.

FIG. 7 is a block diagram illustrating a controller according to an embodiment of the present disclosure, for example, the controller 200 shown in FIG. 1.

Referring to FIG. 7, the controller 200 may include a general operation controller 215, an erased page search controller 235, a command generator 255, and a data receiver 275.

The general operation controller 215 may receive requests RQs from a host (e.g., the host 300 of FIG. 1). For example, each of the requests RQs may be a data write request or a data read request. The general operation controller 215 may generate and transfer a general control signal CTR_N corresponding to the received requests RQs. The command generator 255 may generate a general operation command CMD_NMR to control a semiconductor memory device (e.g., the semiconductor memory device 100 of FIG. 1) to perform a general operation on the basis of the received general control signal CTR_N. The general operation command CMD_NMR may include one of a program command, a read command and an erase command. The read command of the general operation command CMD_NMR may be a general read command. The generated general operation command CMD_NMR may be transferred to the semiconductor memory device 100. The semiconductor memory device 100 may perform an operation corresponding to the received general operation command CMD_NMR on the basis of the general operation command CMD_NMR. When the general operation command CMD_NMR is a program command, the semiconductor memory device 100 may perform a program operation. When the general operation command CMD_NMR is a read command, the semiconductor memory device 100 may perform a read operation. When the general operation command CMD_NMR is an erase command, the semiconductor memory device 100 may perform an erase operation.

After the above-described sudden power-off (SPO) occurs, the erased page search controller 235 may generate and transfer a search control signal CTR_S to search for an erased page of a selected memory block to the command generator 255. The search control signal CTR_S may include address information corresponding to a page for determining whether the page is erased or not. The command generator 255 may generate a search read command CMD_SR to control the semiconductor memory device 100 to perform a search operation of an erased page on the basis of the received search control signal CTR_S. The generated search read command CMD_SR may be transferred to the semiconductor memory device 100. The semiconductor memory device 100 may perform a search read operation on the basis of the received search read command CMD_SR. The search read operation may be different from the general read operation. According to an embodiment, the search read operation may be performed to determine whether a programmed page is included in a predetermined page and subsequent pages of the selected memory block.

In an operational aspect of the semiconductor memory device 100, a general read operation may refer to a data read operation performed by applying a read voltage to a selected word line of a selected memory block and applying a pass voltage to the remaining word lines. According to embodiments of the present disclosure, a search read operation may be performed by selecting a word line corresponding to a selected page and subsequent word lines and applying a read voltage thereto, and applying a pass voltage to the remaining word lines, i.e., word lines that precede the selected word line.

According to embodiments of the present disclosure, preceding word lines and subsequent word lines which are divided on the basis of a search target word line may be determined according to a program order of a page corresponding to each word line. The preceding word lines and the subsequent word lines will be described below in detail with reference to FIGS. 12A to 12D, 13A to 13D, and 14.

The data receiver 275 may receive read data RDATA from the semiconductor memory device 100. The read data RDATA may be result data of the general read operation of the semiconductor memory device 100, or result data of the search read operation of the semiconductor memory device 100.

When the read data RDATA is the result data of the general read operation, the read data RDATA may be data corresponding to the requests RQs from the host 300. Therefore, the read data RDATA may be transferred to the host 300.

When the read data RDATA is the result data of the search read operation, the read data RDATA may be transferred to the erased page search controller 235. The erased page search controller 235 may determine that the currently selected page is an initially erased page on the basis of the read data RDATA received from the data receiver 275. Alternatively, the erased page search controller 235 may generate the search control signal CTR_S to perform an additional search read operation on the basis of the read data RDATA received from the data receiver 275.

The operation of the erased page search controller 235 will be described below with reference to FIG. 10.

Figure 8:
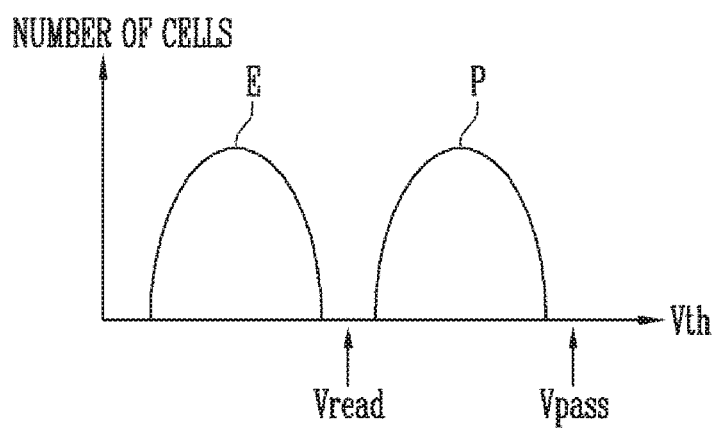
FIG. 8 is a diagram illustrating effects of a search read operation according to an embodiment.

FIG. 8 is a diagram illustrating effects of a search read operation according to an embodiment. For example, FIG. 8 shows a threshold voltage distribution of single-level cells (SLCs) each storing 1-bit data. To store the 1-bit data, a threshold voltage of each of the single-level cells may have one of an erase state E and a program state P after a program operation is completed.

In a general read operation, the read voltage Vread may be applied to a selected word line corresponding to a selected page to read data of the selected page, and the pass voltage Vpass may be applied to the remaining word lines, thereby performing a data read operation. As shown in FIG. 8, in a read operation, the pass voltage Vpass may have a voltage level greater than the read voltage Vread. Therefore, in the general read operation, the pass voltage Vpass having a relatively high voltage level may be applied to memory cells coupled to the unselected word lines. Read disturb may occur when the pass voltage Vpass is applied to the memory cells. Therefore, the threshold voltage distribution of the memory cells may be deteriorated. As a result, the performance of the semiconductor memory device 100 and the storage device 1000 having the semiconductor memory device 100 may be deteriorated.

According to embodiments of the present disclosure, the controller 200 and the semiconductor memory device 100 may use a search read operation instead of a general read operation during a read operation for searching an erased page. During the search read operation, the read voltage Vread may be applied to a selected word line and subsequent word lines of the selected memory block, and the pass voltage Vpass may be applied to preceding word lines of the selected memory block, thereby performing a data read operation. In the general read operation, the pass voltage Vpass may also be applied to the subsequent word lines. However, in the search read operation, the read voltage Vread may be applied to the subsequent word lines.

As described above, according to embodiments of the present disclosure, during a search read operation, the read voltage Vread less than the pass voltage Vpass may be applied to the memory cells coupled to the subsequent word lines that is subsequent to the selected word line although these memory cells may be included in an unselected page. Therefore, the influence caused by read disturb during repetitive read operations may be reduced. As a result, deterioration of the threshold voltage distribution of the memory cells may be prevented. As a result, the performance of the semiconductor memory device 100 and the storage device 1000 having the same may be improved.

Figure 9:
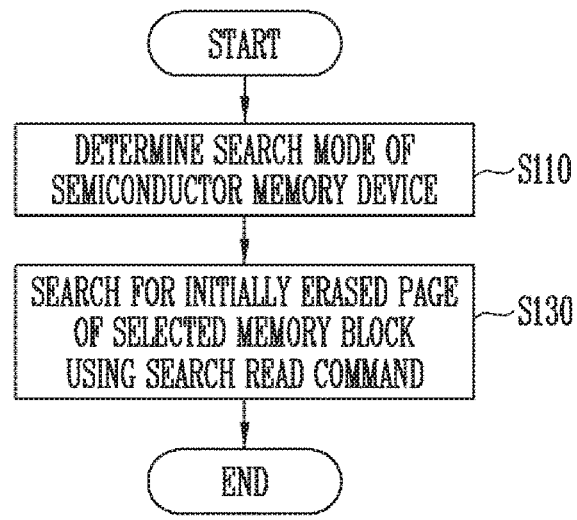
FIG. 9 is a flowchart illustrating a method of operating a controller according to an embodiment.

FIG. 9 is a flowchart illustrating a method of operating a controller according to an embodiment of the invention, for example, the controller 200 of FIG. 7. Referring to FIG. 9, the method of FIG. 9 may include step S110 and step S130. The step S110 may include determining a search mode of the semiconductor memory device 100. The step S130 may include searching for an initially erased page of the semiconductor memory device 100 by using a search read command.

At step S110, the controller 200 may detect that after a sudden power-off occurs, power is supplied again, i.e., power is on. Thus, the controller 200 may recognize that the sudden power-off has occurred and therefore determine a search mode of the semiconductor memory device 100.

When power is supplied again after the above sudden power off occurs, i.e., when power is on, the controller 200 may recognize that the sudden power off has occurred and may resume the program operation of the semiconductor memory device 100 which was being performed before the sudden power off occurred. For example, the controller 200 may resume the program operation on the memory block of the semiconductor memory device 100 to program the memory block with the data which was programmed before the sudden power off occurred.

More specifically, to resume the program operation of the semiconductor memory device 100 which was interrupted due to the sudden power off, the controller 200 may enter a search mode after power is on and may perform a search operation on a plurality of memory blocks in the semiconductor memory device 100 prior to resuming the corresponding program operation.

The search operation may be performed in the search mode to check a state of the program operation which was performed before the sudden power off occurred. In other words, the search operation may be able to detect how many of a plurality of data (not shown) input to the semiconductor memory device 100 are actually programmed into a memory block.

In the search mode, the controller 200 may check a program state or an erase state of each of the pages in the memory block. More specifically, in order to identify an erased page that serves as a boundary between program state and an erase state among a plurality of pages included in a memory block, the controller 200 may perform a read operation on at least one of the physical pages among the plurality of pages included in the memory block.

When the search mode of the semiconductor memory device 100 is determined, a memory block for searching for the initially erased page may be selected at step S110. For example, the controller 200 may distinguish the plurality of memory blocks BLK1 to BLKz in the memory device 100 into a closed block, an open block and a free block in response to a search mode. The closed block may represent a memory block whose pages are all written with data and there are no pages left to perform a program operation. The open block may represent a memory block in which some pages are programmed with data and other pages are in an erase state. The free block may represent a memory block whose pages are all in the erase state. The controller 200 may select at least one open block, among the memory blocks BLK1 to BLKz, as a memory block for which an initially erased page is searched.

At step S130, the selected memory block may be searched for the initially erased page. In this process, the controller 200 may search for the initially erased page of the selected memory block by using a search read command. As described above, the semiconductor memory device 100 may receive the search read command and perform the search read operation by applying the read voltage to the selected word line and the subsequent word lines of the selected memory block, and by applying the pass voltage to the remaining word lines, i.e., the preceding word lines of the selected memory block. During the search read operation, since the read voltage Vread less than the pass voltage Vpass is applied to the subsequent word lines following the selected word line, read disturb caused by repetitive read operations may be reduced.

Figure 10:
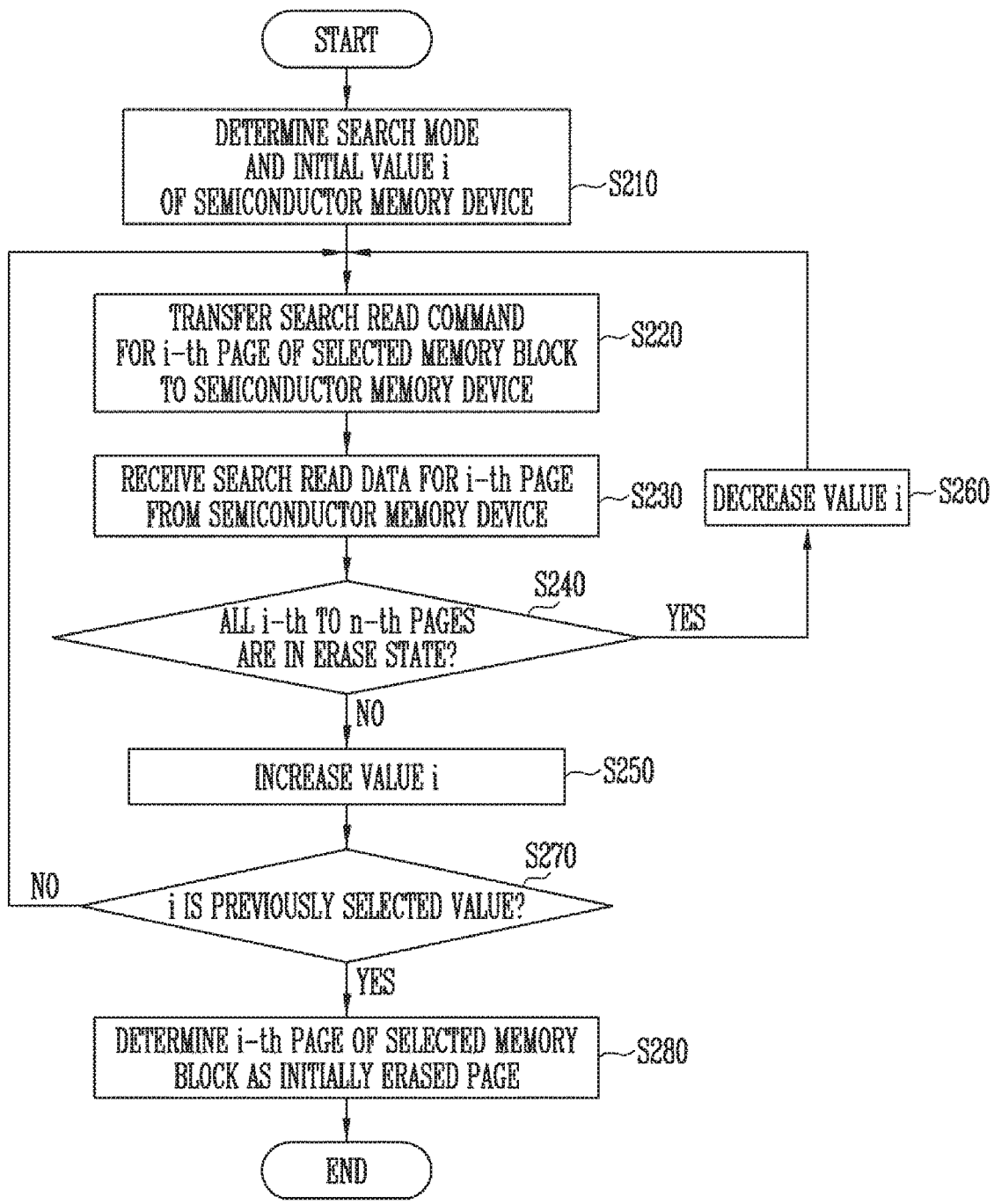
FIG. 10 is a detailed flowchart illustrating a method of operating a controller according to an embodiment.

FIG. 10 is a detailed flowchart illustrating a method of operating a controller according to an embodiment, for example, the controller 200 of FIG. 7.

Referring to FIG. 10, the method of FIG. 10 may start with step S210 of determining a search mode of the semiconductor memory device 100 and determining an initial value i. Step S210 may correspond to step S110 of FIG. 9. The remaining steps S220 to S280 of FIG. 10 may correspond to step S130 of FIG. 9.

At step S210, the controller 200 may detect that after a sudden power-off occurs, power is supplied again, i.e., power is on. Thus, the controller 200 may recognize that the sudden power-off has occurred and therefore determine a search mode of the semiconductor memory device 100. The initial value i may be determined for an erased page search. The value i may correspond to a page address for performing a search read operation to determine program/erase. In the example of FIG. 4, the initial value i may be one of the values 1 to n corresponding to indices of the word lines. The initial value i may vary depending on a search method of an erased page. For example, in a linear search method, the initial value i may be determined as '1'. In another example, according to a binary search method, the initial value i may be determined as n/2. When n/2 is not an integer, an integer value approximate thereto may be the initial value i. Step S210 may be performed by the erased page search controller 235 of FIG. 7.

In FIG. 10, in relation to a program order of a memory block and the number corresponding to each page, it may be assumed that first to n-th pages are programmed starting from the first page. In other words, pages with smaller numbers may be programmed before pages with larger numbers.

At step S220, a search read command for an i-th page of the selected memory block may be transferred to the semiconductor memory device 100. Step S220 may be performed by the command generator 255 of FIG. 7.

The semiconductor memory device 100 may receive the search read command and perform a search read operation on the i-th page. The semiconductor memory device 100 may generate search read data, and transfer the search read data as a result of the search read operation to the controller 200.

According to embodiments of the present disclosure, the search read data corresponding to the i-th page may indicate whether the i-th to n-th pages include at least one programmed page.

Referring also to FIG. 8, it may be assumed that the memory cells corresponding to the erase state E store data of a logical high value '1' and the memory cells corresponding to the program state P store data of a logical low value '0'. In this example, when all bit data in the search read data are a logical high value '1', it may indicate that all of the i-th to n-th pages are erased pages. When the search read data includes a logical low value '0', it may indicate that the i-th to n-th pages include at least one programmed page. Therefore, considering the program order in which the first page starts to be programmed first and the second to n-th pages are sequentially programmed, the i-th page may be a programmed page.

In FIG. 8, it may be assumed that the memory cells corresponding to the erase state E store data of a logical low value '0' and the memory cells corresponding to the program state P store data of a logical high value '1'. In the above example, when all bit data in the search read data are a logical low value '0', it may indicate that all of the i-th to n-th pages are erased pages. When the search read data include 1-bit of data, it may indicate that the i-th to n-th pages include at least one programmed page. Therefore, considering the program order of the pages in the memory block, the i-th page may be a programmed page.

The search read operation of the semiconductor memory device 100 and characteristics of the search read data will be described below with reference to FIGS. 12A to 12D.

At step S230, the controller 200 may receive the search read data with respect to the i-th page from the semiconductor memory device 100. Step S230 may be performed by the data receiver 275 of FIG. 7. Since the received data is the search read data, the data receiver 275 may transfer the received data to the erased page search controller 235.

At step S240, it may be determined whether all of the i-th to n-th pages are in an erase state E. Step S240 may be performed by the erased page search controller 235 of FIG. 7. Step S240 will be described in more detail with reference to FIG. 11.

When all of the i-th to n-th pages are in the erase state E as a result of determination at step S240 (that is, "YES" at step S240), the value i may be decreased at step S260. Steps S220 to S240 may be repetitively performed with respect to the decreased value i.

When at least one of the i-th to n-th pages is a programmed page as a result of determination at step S240 (that is, "NO" at step S240), the value i may be increased at step S250. It may be determined whether the increased value i is a previously selected value at step S270. In this manner, it may be determined whether a page corresponding to the increased value i is an initially erased page or a programmed page. As a result of determination at step S270, when the value i is the previously selected value (that is, "YES" at step S270), the i-th page of the selected memory block may be determined as the initially erased page at step S280.

As the result of determination at step S270, when the value i is not previously selected (that is, "NO" at step S270), steps S220 to S250 may be performed again. Changing the value i and operations performed according to whether the changed value i is the previously selected value through steps S240, S250, S260, and S270 will be described below with reference to FIGS. 12A to 12D or 13A to 13D.

At steps S250 and S260 where the value i is increased or decreased, the value i may be determined by various methods.

According to an embodiment, a binary search method may be used as one of the methods of determining the value i. According to the binary search method, an intermediate value of a maximum page number and a minimum page number may be selected for the value i. When a page corresponding to the selected value i is a programmed page, the corresponding value i may be a new minimum value. When the page corresponding to the selected value i is an erased page, the corresponding value i may be a new maximum value. The above process may then be repeated by selecting the intermediate value between the new maximum value and the minimum value and determining the intermediate value as the value i. A linear search method will be described below with reference to FIGS. 13A to 13D.

According to an embodiment, the linear search method may be used as one of the methods of determining the value i. According to the linear search method, the value i may be increased with an increment of 1 (or one). The linear search method will be described below with reference to FIGS. 13A to 13D.

In comparison with the linear search method, the binary search method provides a complex algorithm implementation but a higher speed.

However, the methods described above such as the binary and the linear search methods are mere examples, and the value i for searching for the initially erased page may be determined by various other methods in addition to the linear search method and the binary search method.

Figure 11:
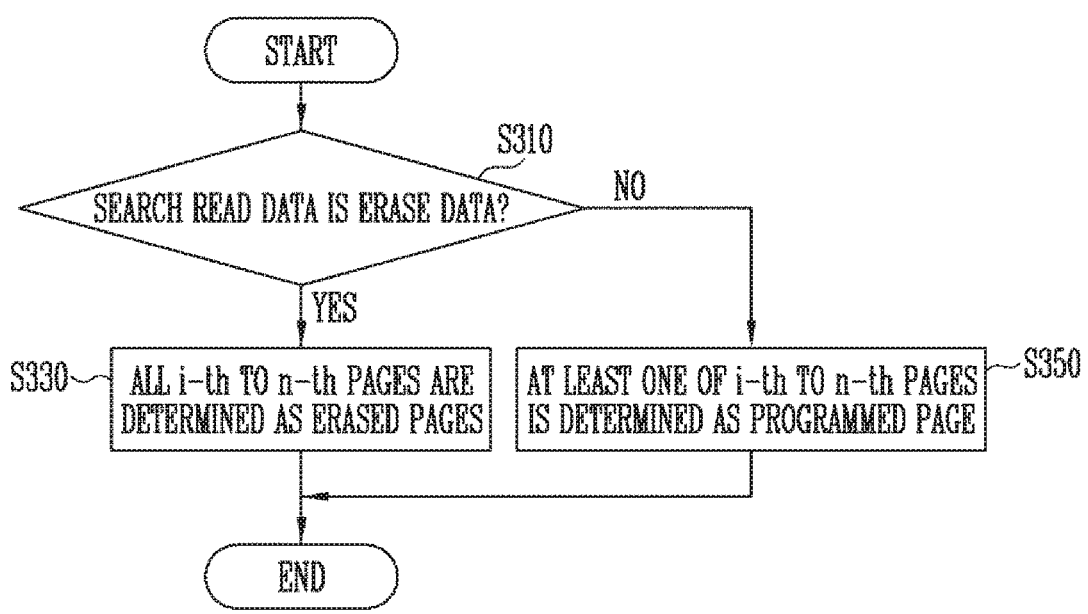
FIG. 11 is a flowchart illustrating step S240 of FIG. 10.

FIG. 11 is a flowchart for illustrating step S240 of FIG. 10.

Referring to FIG. 11, step S240 may include step S310 of determining whether the search read data is erase data. In other words, at step S310, it may be determined whether all bits in the search read data are data corresponding to the erase state E of FIG. 8. When the search read data is the erase data (that is, "YES" at step S310), it may mean that all of the i-th to n-th pages are erased pages as described above. Therefore, the process proceeds to step S330 and it may be determined that all of the i-th to n-th pages are in the erase state E.

When the search read data includes bits of data corresponding to the program state P of FIG. 8 (that is, "NO" at step S310), it may indicate that not all of the i-th to n-th pages are erased pages. Therefore, the process proceeds to step S350, where it may be determined that at least one of the i-th to n-th pages is programmed. According to a program order in which pages with smaller numbers are programmed before pages with larger numbers, the i-th page may be a programmed page.

FIGS. 12A, 12B, 12C and 12D are diagrams illustrating a method of determining an initially erased page through a search read operation according to a binary search method. By way of example, FIGS. 12A, 12B, 12C and 12D illustrate a memory block including first to sixteenth pages PAGE1 to PAGE16. As illustrated in FIGS. 12A, 12B, 12C and 12D, hatched boxes represent programmed pages and unhatched boxes represent erased pages. In other words, the first to thirteenth pages PAGE1 to PAGE13 are programmed pages and fourteenth to sixteenth pages PAGE14 to PAGE16 are erased pages. Hereinafter, a description will be made with reference to FIGS. 10, 11, 12A, 12B, 12C and 12D.

As described in step S210 of FIG. 10, the initial value i may be determined. According to an embodiment in which the binary search method is used, the initial value i may be determined by an intermediate value between the maximum value and the minimum value. Since the maximum value is 16 and the minimum value is 1, the initial value i may be determined as 8.

Figure 12A:
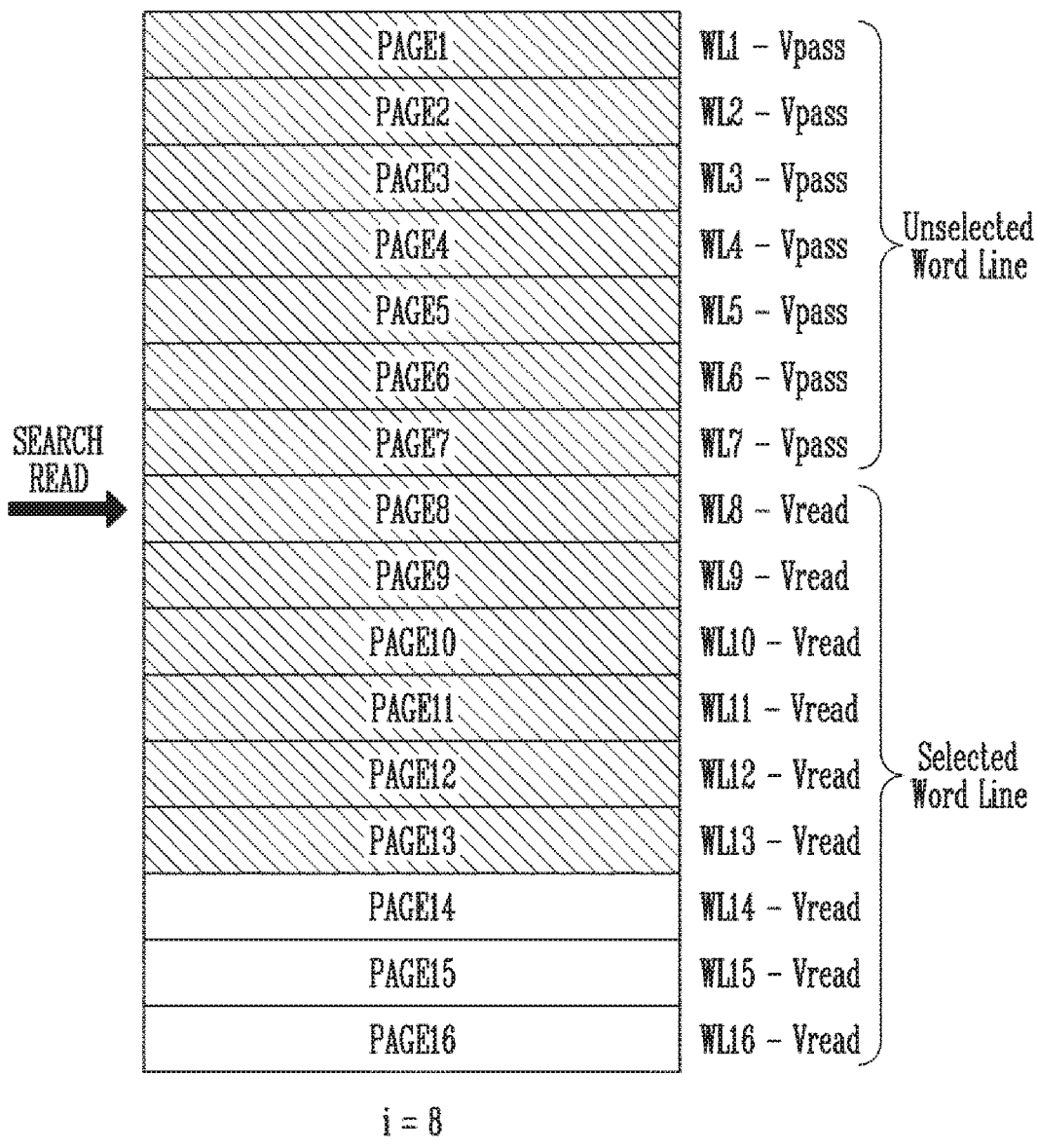
FIGS. 12A, 12B, 12C and 12D are diagrams illustrating a method of determining an initially erased page through a search read operation according to a binary search method.

In FIG. 12A, since the value i is determined as eight, the controller 200 may transfer a search read command for the eighth page to the semiconductor memory device 100 (e.g., S220 of FIG. 10). The semiconductor memory device 100 may perform a search read operation on the eighth page PAGE8 in response to the received search read command. To perform the search read operation on the eighth page PAGE8, the semiconductor memory device 100 may apply the pass voltage Vpass to first to seventh word lines WL1 to WL7 corresponding to first to seventh pages PAGE1 to PAGE7, and may apply the read voltage Vread to eighth to sixteenth word lines WL8 to WL16 corresponding to eighth to sixteenth pages PAGE8 to PAGE16. The first to seventh word lines WL1 to WL7 to which the pass voltage Vpass is applied may be referred to as unselected word lines. The eighth to sixteenth word lines WL8 to WL16 to which the read voltage Vread is applied may be referred to as selected word lines. In other words, in a search read operation, the pass voltage Vpass may be applied to preceding word lines (i.e., the first to seventh word lines WL1 to WL7) preceding a target word line (i.e., the eighth word line WL8 which is the search target), and the read voltage Vread may be applied to subsequent word lines (i.e., the ninth to sixteenth word lines WL9 to WL16 which follow (or is subsequent to) the target word line (i.e., the eighth word line WL8). The read voltage Vread may also be applied to the target word line (i.e., the eighth word line WL8).

Since eighth to thirteenth pages PAGE8 to PAGE13 are programmed pages, the search read data may include bits of data indicating the program state P. The semiconductor memory device 100 may transfer the search read data to the controller 200.

The search read data which the controller 200 receives may be different from data actually stored in the eighth page PAGE8. However, since the search read data is for determining whether the eighth page PAGE8 is a programmed page or an erased page, the search read data may not be the actual data of the eighth page PAGE8.

In a general read operation that is performed to read data stored in a selected page, a read operation may be performed with a read voltage applied to a word line coupled to the selected page and a pass voltage applied to the remaining word lines.

On the other hand, a search read operation may be performed to determine whether the selected page is an erased page or a programmed page, and actual data may not have to be read. Therefore, by determining whether at least one of the eighth to sixteenth pages PAGE8 to PAGE16 is programmed, it may also be determined whether the eighth page PAGE8 is programmed according to the program order of the pages. Since a page with a smaller number is programmed earlier than a page with a larger number, when at least one of the eighth to sixteenth pages PAGE8 to PAGE16 is programmed, the eighth page PAGE8 may always be a programmed page.

Therefore, the erased page search controller 235 of the controller 200 may determine whether all of the eighth to sixteenth pages PAGE8 to PAGE16 are erased on the basis of the search read data. Since the search read data includes the bits of data indicating the program state P, the process proceeds to step S250 to increase the value i. By the binary search method, since eight becomes the new minimum value and the maximum value becomes 16, 12 may be selected as the new value i. As a result of determination at step S270, since 12 is not previously selected, the process proceeds to step S220.

Figure 12B:
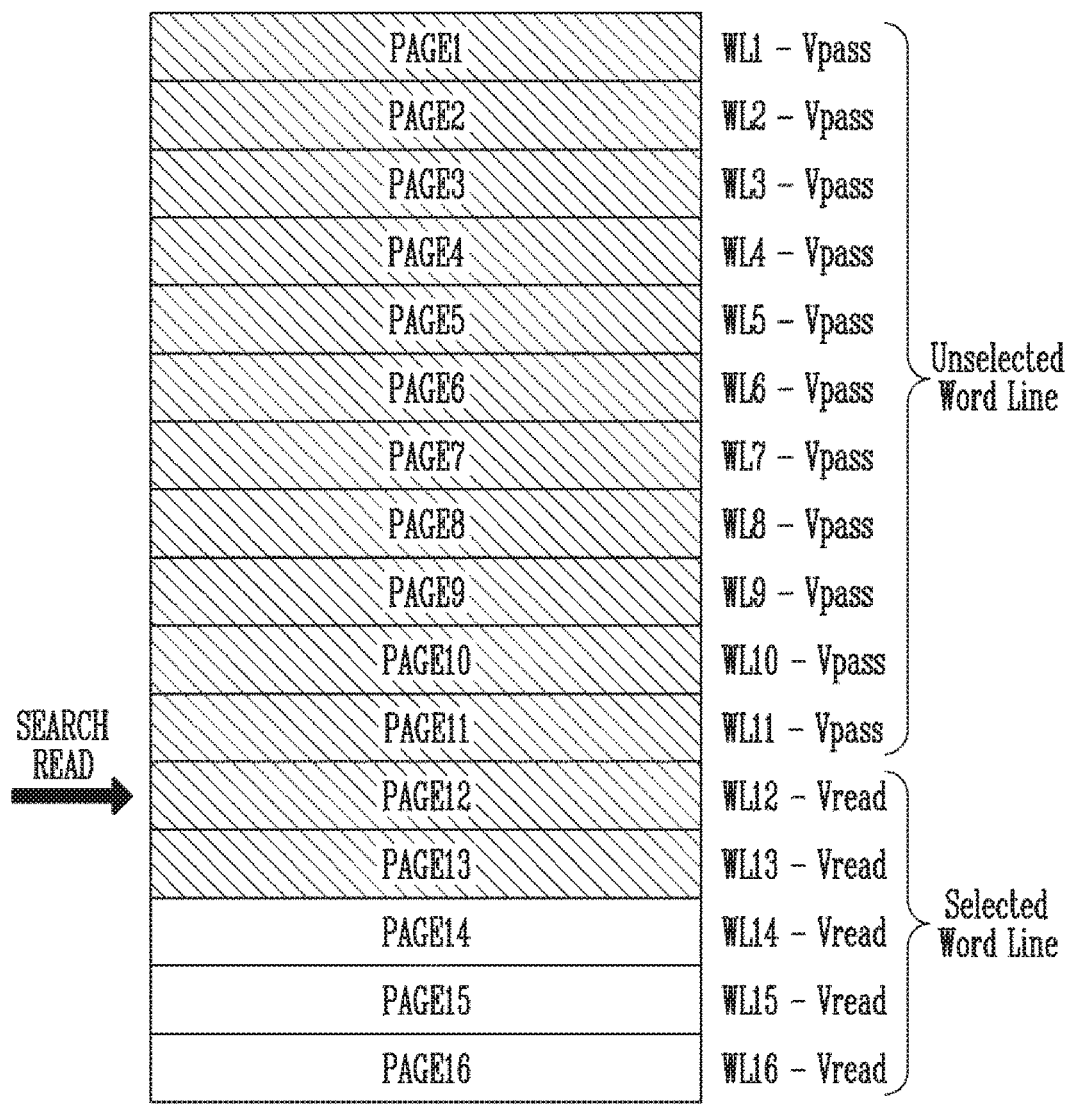

Referring to FIG. 12B, the controller 200 may generate a search read command for the value i which is newly selected as and may transfer the search read command to the semiconductor memory device 100 (S220 of FIG. 10). The semiconductor memory device 100 may perform a search read operation on a twelfth page PAGE12 as a search target. Therefore, a read operation may be performed with the pass voltage Vpass applied to the first to eleventh word lines WL1 to WL11 and the read voltage Vread applied to the twelfth to sixteenth word lines WL12 to WL16.

Since the twelfth and thirteenth pages PAGE12 to PAGE13 are programmed pages, the search read data may include the bits of data indicating the program state P. The semiconductor memory device 100 may transfer the search read data to the controller 200.

The erased page search controller 235 of the controller 200 may determine whether all of the twelfth to sixteenth pages PAGE12 to PAGE16 are in an erase state E on the basis of the search read data. Since the search read data include bits of data indicating the program state P, the process proceeds to step S250 to increase the value i. By the binary search method, since 12 becomes the new minimum value, and the maximum value is 16, may be selected as the new value i. As a result of determination at step S270, since 14 is not previously selected, the process proceeds to step S220.

Figure 12C:
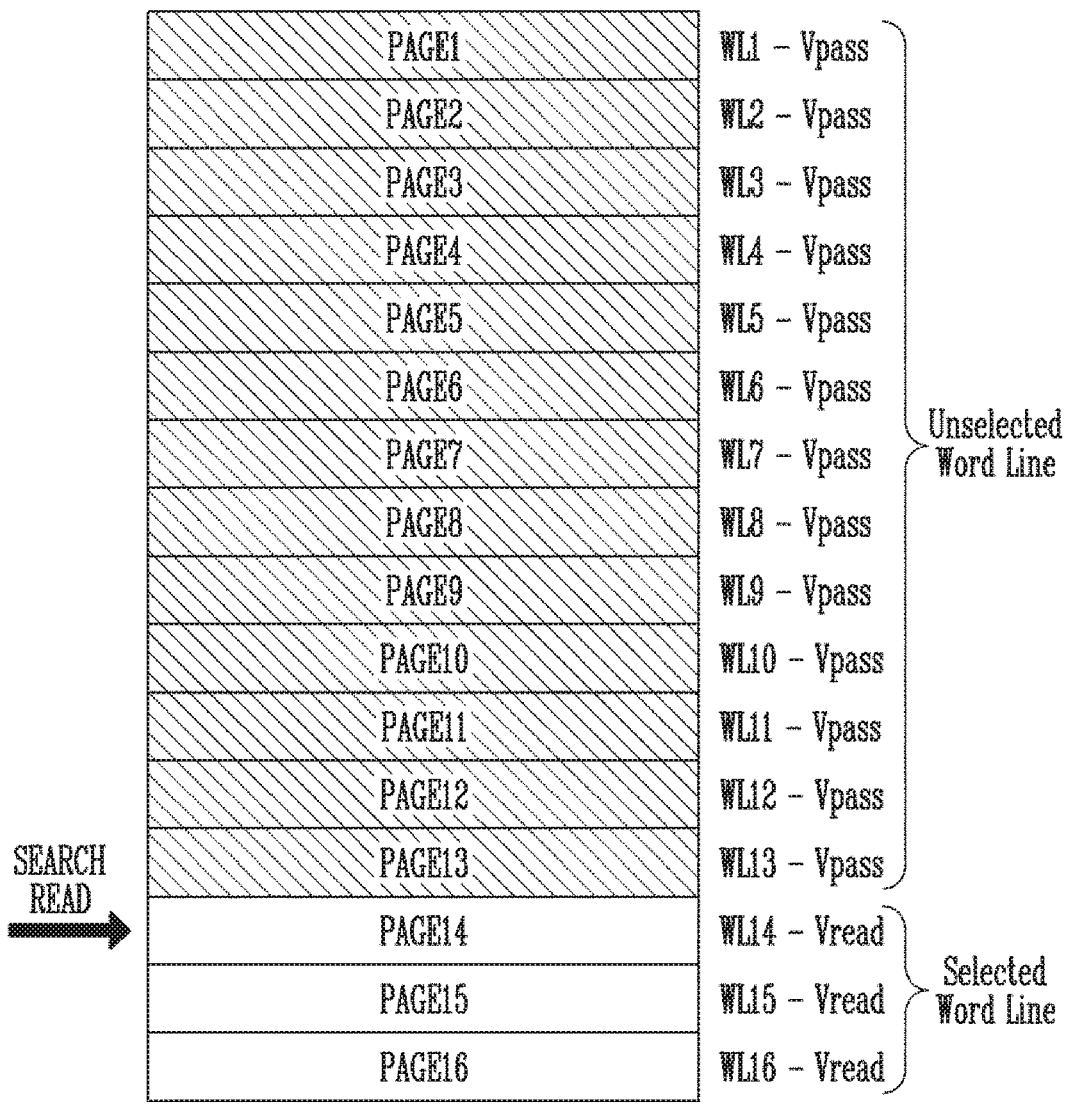

Referring to FIG. 12C, the controller 200 may generate a search read command for the value i which is newly selected as and may transfer the search read command to the semiconductor memory device 100 (S220 of FIG. 10). The semiconductor memory device 100 may perform a search read operation on a fourteenth page PAGE14 as a search target. Therefore, a read operation may be performed with the pass voltage Vpass applied to the first to thirteenth word lines WL1 to WL13 and the read voltage Vread applied to the fourteenth to sixteenth word lines WL14 to WL16.

Since all of the fourteenth to sixteenth pages PAGE14 to PAGE16 are erased pages, the search read data may include only bits of data indicating the erase state E. The semiconductor memory device 100 may transfer the search read data to the controller 200.

The erased page search controller 235 of the controller 200 may determine whether all of the fourteenth to sixteenth pages PAGE14 to PAGE16 are erased on the basis of the search read data. Since the search read data include only the bits of data indicating the erase state E, the process proceeds to step S260 to decrease the value i. By a binary search method, 14 may be the new maximum value and the minimum value of 12 may be maintained. Therefore, 13 may be selected as the new value i. As a result of determination at step S270, since 13 is not previously selected, the process proceeds to step S220.

Figure 12D:
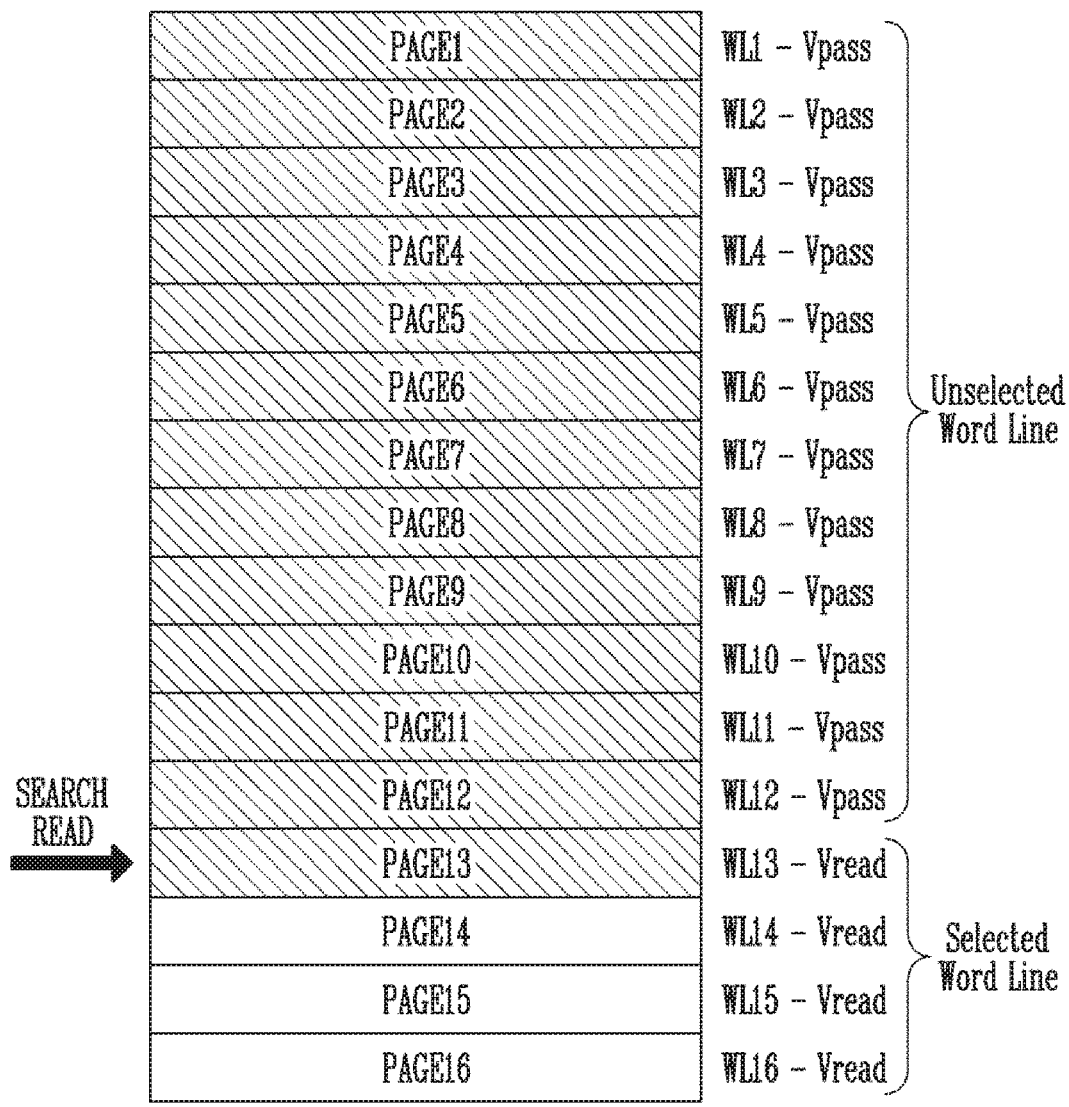

Referring to FIG. 12D, the controller 200 may generate a search read command for the value i which is newly selected as and may transfer the search read command to the semiconductor memory device 100 (S220 of FIG. 10). The semiconductor memory device 100 may perform a search read operation on the thirteenth page PAGE13 as a search target. Therefore, a read operation may be performed with the pass voltage Vpass applied to the first to twelfth word lines WL1 to WL12 and the read voltage Vread applied to the thirteenth to sixteenth word lines WL13 to WL16.

Since the thirteenth page PAGE13 is a programmed page, the search read data may include the bits of data indicating the program state P. The semiconductor memory device 100 may transfer the search read data to the controller 200.

The erased page search controller 235 of the controller 200 may determine whether all of the thirteenth to sixteenth pages PAGE13 to PAGE16 are in an erase state E on the basis of the search read data. Since the search read data include the bits of data indicating the program state P, the process proceeds to step S250 to increase the value i. By the binary search method, since 13 becomes the new minimum value, and the maximum value is 14, 14 may be selected as the new value i. As a result of determination at step S270, the process proceeds to step S280, so that the currently selected fourteenth page PAGE14 may be determined as the initially erased page.

Referring to FIGS. 12A to 12D, a read operation may be performed four times to search for an initially erased page according to a binary search method. When a search read operation is performed, the number of times a pass voltage Vpass is applied to each word line during the read operation performed four times is shown in Table 1.

TABLE 1

| Word line | Number of times pass voltage (Vpass) is applied |
| --- | --- |
| WL1 | 4 |
| WL2 | 4 |
| WL3 | 4 |
| WL4 | 4 |
| WL5 | 4 |
| WL6 | 4 |
| WL7 | 4 |
| WL8 | 3 |
| WL9 | 3 |
| WL10 | 3 |
| WL11 | 3 |
| WL12 | 2 |
| WL13 | 1 |
| WL14 | 0 |
| WL15 | 0 |
| WL16 | 0 |

On the other hand, when an initially erased page is searched for by using a general read operation, not a search read operation, the number of times a pass voltage Vpass is applied to each word line during the read operation performed four times is shown below in Table 2.

TABLE 2

| Word line | Number of times pass voltage (Vpass) is applied |
| --- | --- |
| WL1 | 4 |
| WL2 | 4 |
| WL3 | 4 |
| WL4 | 4 |
| WL5 | 4 |
| WL6 | 4 |
| WL7 | 4 |
| WL8 | 3 |

TABLE 2-continued

| Word line | Number of times pass voltage (Vpass) is applied |
| --- | --- |
| WL9 | 4 |
| WL10 | 4 |
| WL11 | 4 |
| WL12 | 3 |
| WL13 | 3 |
| WL14 | 3 |
| WL15 | 4 |
| WL16 | 4 |

In comparison with an operation of searching for an initially erased page by using a general read operation, referring to Tables 1 and 2, when the search read operation according to an embodiment of the present disclosure is used, the number of times the pass voltage Vpass is applied to each of the ninth to twelfth word lines WL9 to WL12 may be decreased by one, the number of times the pass voltage Vpass is applied to the thirteenth word line WL13 may be decreased by two, the number of times the pass voltage Vpass is applied to the fourteenth word line WL14 may be decreased by three, and the number of times the pass voltage Vpass is applied to the fifteenth and sixteenth word lines WL15 and WL16 may be decreased by four. When the number of read operations performed to search for the initially erased page is increased as the number of word lines is increased, a range of word lines with a reduced number of times the pass voltage Vpass is applied, and a decrease width in the number of times the pass voltage Vpass is applied may also be increased.

As described above, in various embodiments, a search read operation may be used to search for an initially erased page to reduce the number of times a pass voltage is applied, so that read disturb may be reduced.

In the embodiment illustrated with reference to FIGS. 12A to 12D, a read voltage Vread may be applied to the i-th to sixteenth word lines during a search read operation. In other words, in the embodiment illustrated in FIGS. 12A to 12D, the read voltage Vread may be applied to all word lines from the i-th word line to the last word line WL16. However, the present disclosure is not limited thereto, and the read voltage Vread may be applied to the i-th word line and some of the subsequent word lines. For example, in the example of FIG. 12A, it is illustrated that the read voltage Vread is applied to the eighth to sixteenth word lines WL8 to WL16 when the value i is eight. However, according to an embodiment, the read voltage Vread may be applied to the eighth to twelfth word lines WL8 to WL12, and the pass voltage Vpass may be applied to the thirteenth to sixteenth word lines WL13 to WL16. In another example, when the value i is eight, the read voltage Vread may be applied to the eighth and ninth word lines WL8 and WL9, and the pass voltage Vpass may be applied to the tenth to sixteenth word lines WL10 to WL16.

FIGS. 13A, 13B, 13C and 13D are diagrams illustrating a method of determining an initially erased page through a search read operation according to a linear search method. Hereinafter, a description will be made with reference to FIGS. 10, 11, 13A, 13B, 13C and 13D.

As described in step S210 of FIG. 10, the initial value i may be determined. According to an embodiment in which a linear search method is used, the initial value i may be determinced as 1.

Figure 13A:
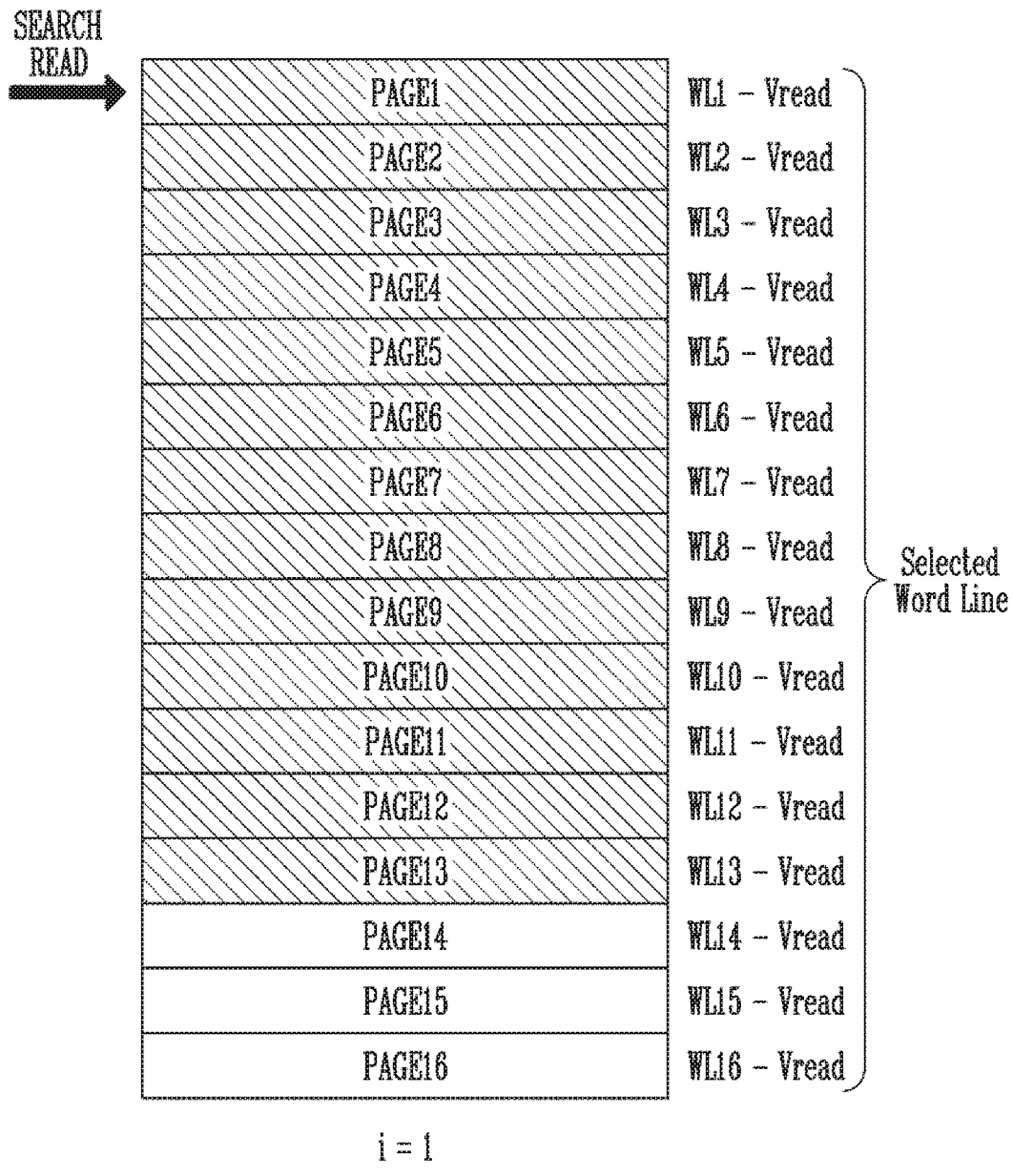
FIGS. 13A, 13B, 13C and 13D are diagrams illustrating a method of determining an initially erased page through a search read operation according to a linear search method.

In FIG. 13A, since the value i is determined as 1, the controller 200 may transfer a search read command for the first page to the semiconductor memory device 100 (S220 of FIG. 10). The semiconductor memory device 100 may perform a search read operation on the first page PAGE1 in response to the received search read command. To perform the search read operation on the first page PAGE1, a read voltage Vread may be applied to the first to sixteenth word lines WL1 to WL16 corresponding to the first to sixteenth pages PAGE1 to PAGE16, respectively.

Since the first to thirteenth pages PAGE1 to PAGE13 are programmed pages, the search read data may include the bits of data indicating the program state P. The semiconductor memory device 100 may transfer the search read data to the controller 200.

The erased page search controller 235 of the controller 200 may determine whether all of the first to sixteenth pages PAGE1 to PAGE16 are in an erase state E on the basis of the search read data. Since the search read data include the bits of data indicating the program state P, the process proceeds to step S250 to increase the value i. By the linear search method, two may be selected as the new value i. As a result of determination at step S270, since two is not previously selected, the process proceeds to step S220.

Figure 13B:
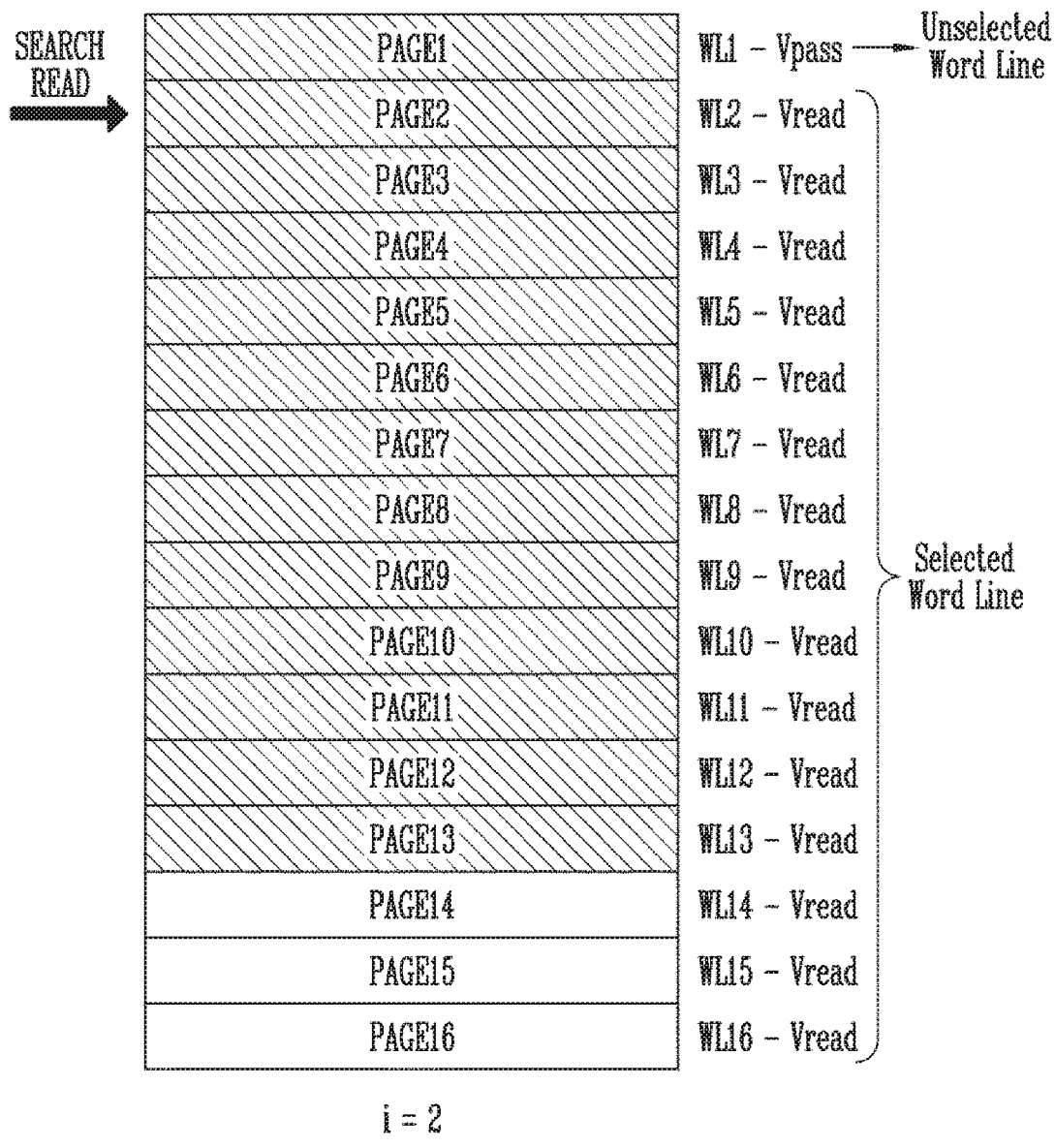

Referring to FIG. 13B, the controller 200 may generate a search read command for the value i which is newly selected as two and may transfer the search read command to the semiconductor memory device 100 (S220 of FIG. 10). The semiconductor memory device 100 may perform a search read operation on a second page PAGE2 as a search target. Therefore, a read operation may be performed with the pass voltage Vpass applied to the first word line WL1 and the read voltage Vread applied to the second to sixteenth word lines WL2 to WL16.

Since the second to thirteenth pages PAGE2 to PAGE13 are programmed pages, the search read data may include the bits of data indicating the program state P. The semiconductor memory device 100 may transfer the search read data to the controller 200.

The erased page search controller 235 of the controller 200 may determine whether all of the second to sixteenth pages PAGE2 to PAGE16 are in an erase state E on the basis of the search read data. Since the search read data include the bits of data indicating the program state P, the process proceeds to step S250 to increase the value i. By the linear search method, three may be selected as the new value i. As a result of determination at step S270, since three is not previously selected, the process proceeds to step S220.

By repeating the linear search method as above, search read operations on the third to twelfth pages PAGE3 to PAGE12 may be performed. In FIGS. 13A to 13D, the search read operations on the third to twelfth pages are omitted.

Figure 13C:
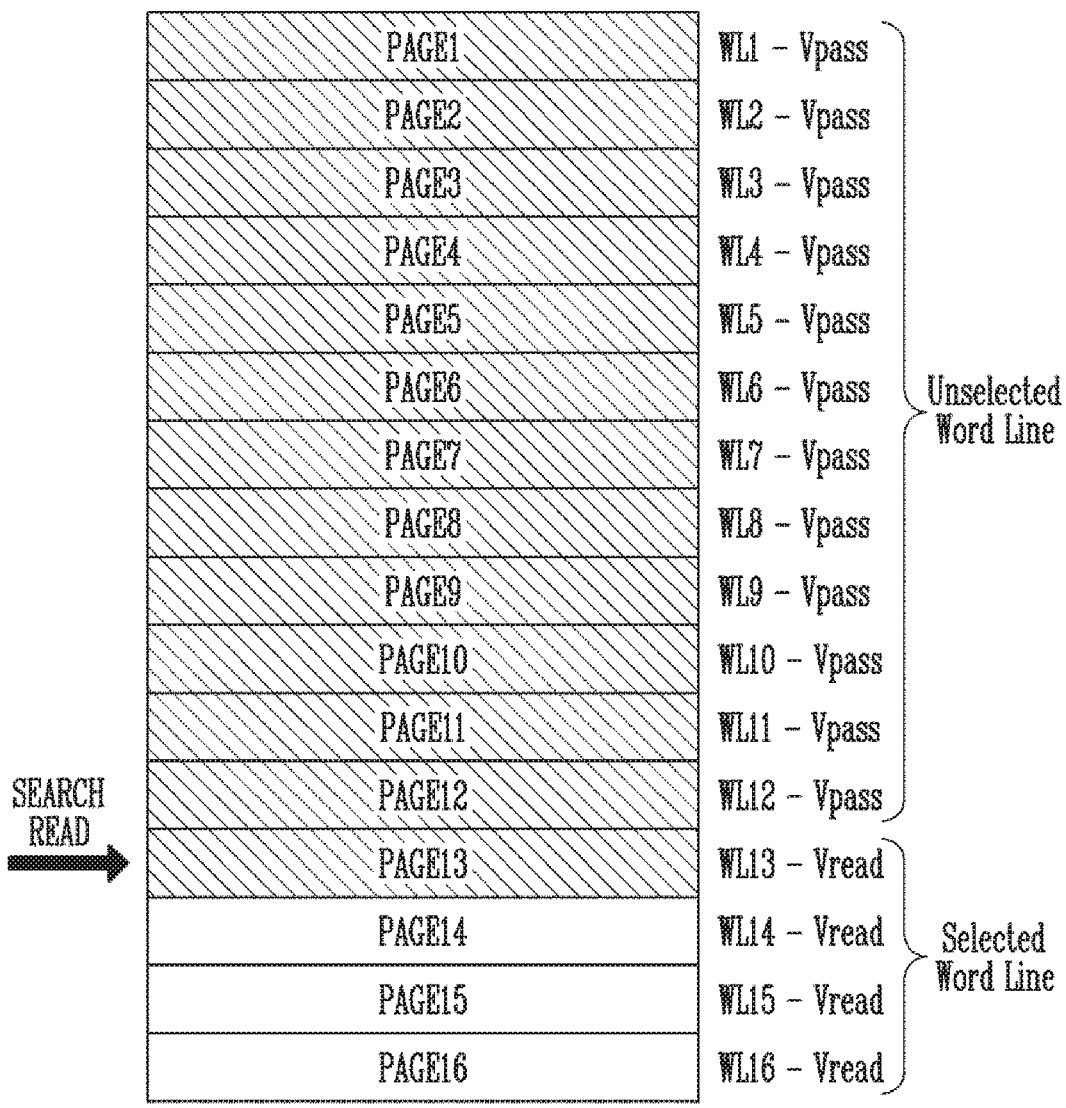

Since the twelfth page PAGE12 is also a programmed page, as shown in FIG. 13C, the controller 200 may generate a search read command for the value i which is newly selected as and may transfer the search read command to the semiconductor memory device 100 (S220 of FIG. 10). The semiconductor memory device 100 may perform a search read operation on the thirteenth page PAGE13 as a search target. Therefore, a read operation may be performed with the pass voltage Vpass applied to the first to twelfth word lines WL1 to WL12 and the read voltage Vread applied to the thirteenth to sixteenth word lines WL13 to WL16.

Since the thirteenth page PAGE13 is a programmed page, the search read data may include the bits of data indicating the program state P. The semiconductor memory device 100 may transfer the search read data to the controller 200.

The erased page search controller 235 of the controller 200 may determine whether all of the thirteenth to sixteenth pages PAGE13 to PAGE16 are in an erase state E on the basis of the search read data. Since the search read data include the bits of data indicating the program state P, the process proceeds to step S250 to increase the value i. By the linear search method, may be selected as the new value i. As a result of determination at step S270, since 14 is not previously selected, the process proceeds to step S220.

Figure 13D:
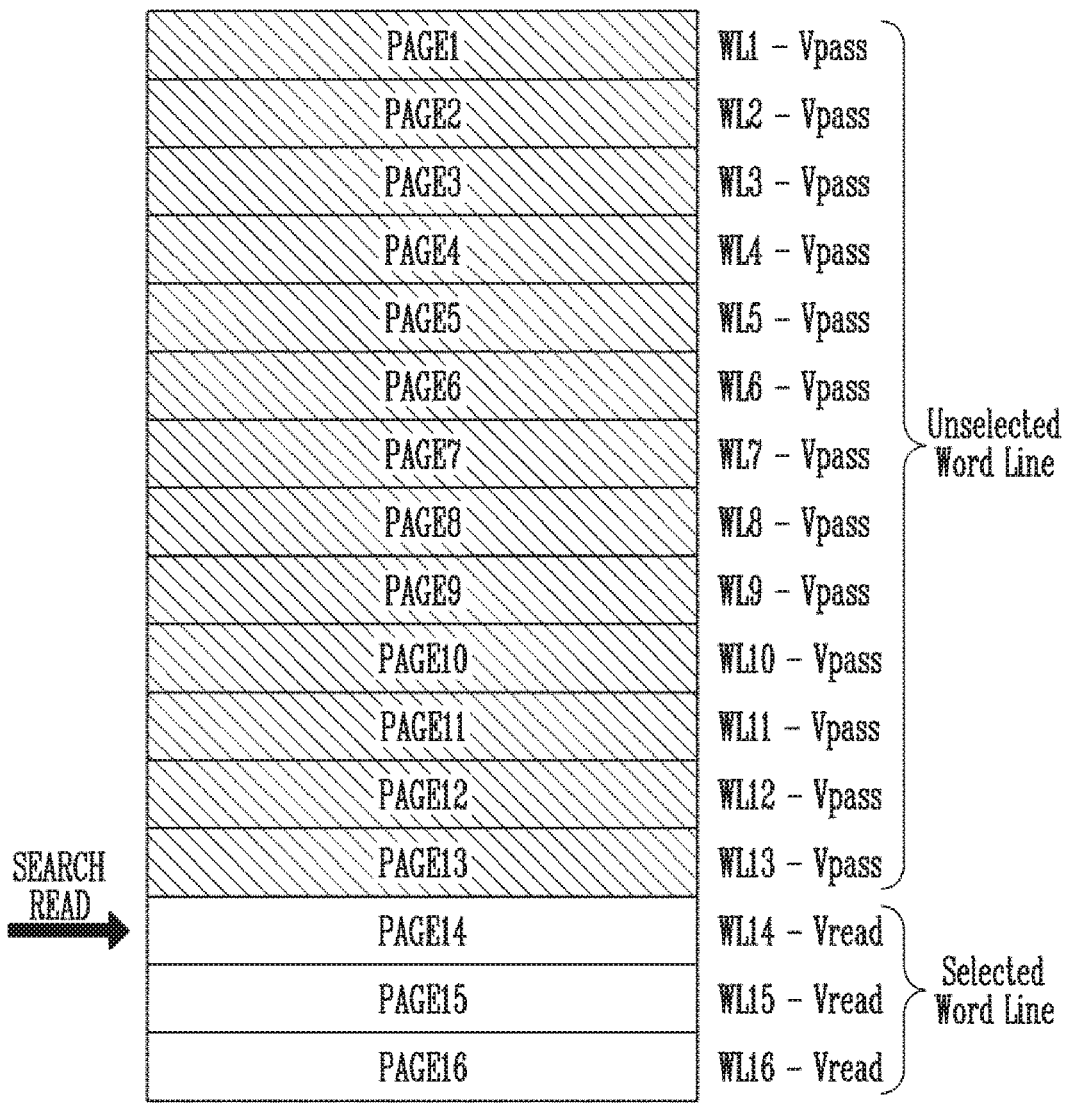

Referring to FIG. 13D, the controller 200 may generate a search read command for the value i which is newly selected as and may transfer the search read command to the semiconductor memory device 100 (S220 of FIG. 10). The semiconductor memory device 100 may perform a search read operation on the fourteenth page PAGE14 as a search target. Therefore, a read operation may be performed with the pass voltage Vpass applied to the first to thirteenth word lines WL1 to WL13 and the read voltage Vread applied to the fourteenth to sixteenth word lines WL14 to WL16.

Since the fourteenth to sixteenth pages PAGE14 to PAGE16 are erased pages, the search read data may include only the bits of data indicating the erase state E. The semiconductor memory device 100 may transfer the search read data to the controller 200.

The erased page search controller 235 of the controller 200 may determine whether all of the fourteenth to sixteenth pages PAGE14 to PAGE16 are in an erase state E on the basis of the search read data.

Since the search read data include only the bits of data indicating the erase state E, the process proceeds to step S260 to decrease the value i. Therefore, 13 may be selected as the new value i. The process proceeds to step S220, and as shown in FIG. 13C, a search read operation may be performed again. At step S250, i may be selected as 14 again. As a result of determination at step S270, since 14 is previously selected, the fourteenth page PAGE14 may be determined as an initially erased page.

Both linear search and binary search are applicable to the embodiment of FIG. 10. In another embodiment, to prevent the thirteenth page PAGE13 from being repetitively read, the embodiment of FIG. 10 may be modified. For example, when a linear search method is used, if the i-th to n-th pages are erased as a result of determination at step S240, the process may proceed directly to step S280 to determine that a page corresponding to the current value i is the initially erased page without proceeding to step S260 to decrease the value i. As shown in FIG. 13D, when the fourteenth to sixteenth pages PAGE14 to PAGE16 are determined as erased pages as a search read result, the process proceeds to step S280 to determine that the fourteenth page PAGE14 is an initially erased page.

As shown in FIGS. 12A to 12D and 13A to 13D, the method of searching for the initially erased page using the search read operation may be applicable to the binary search method and the linear search method. However, the initially erased page may also be searched for by applying the search read operation to various other methods which are not shown in FIGS. 12A to 12D and FIGS. 13A to 13D.

Figure 14:
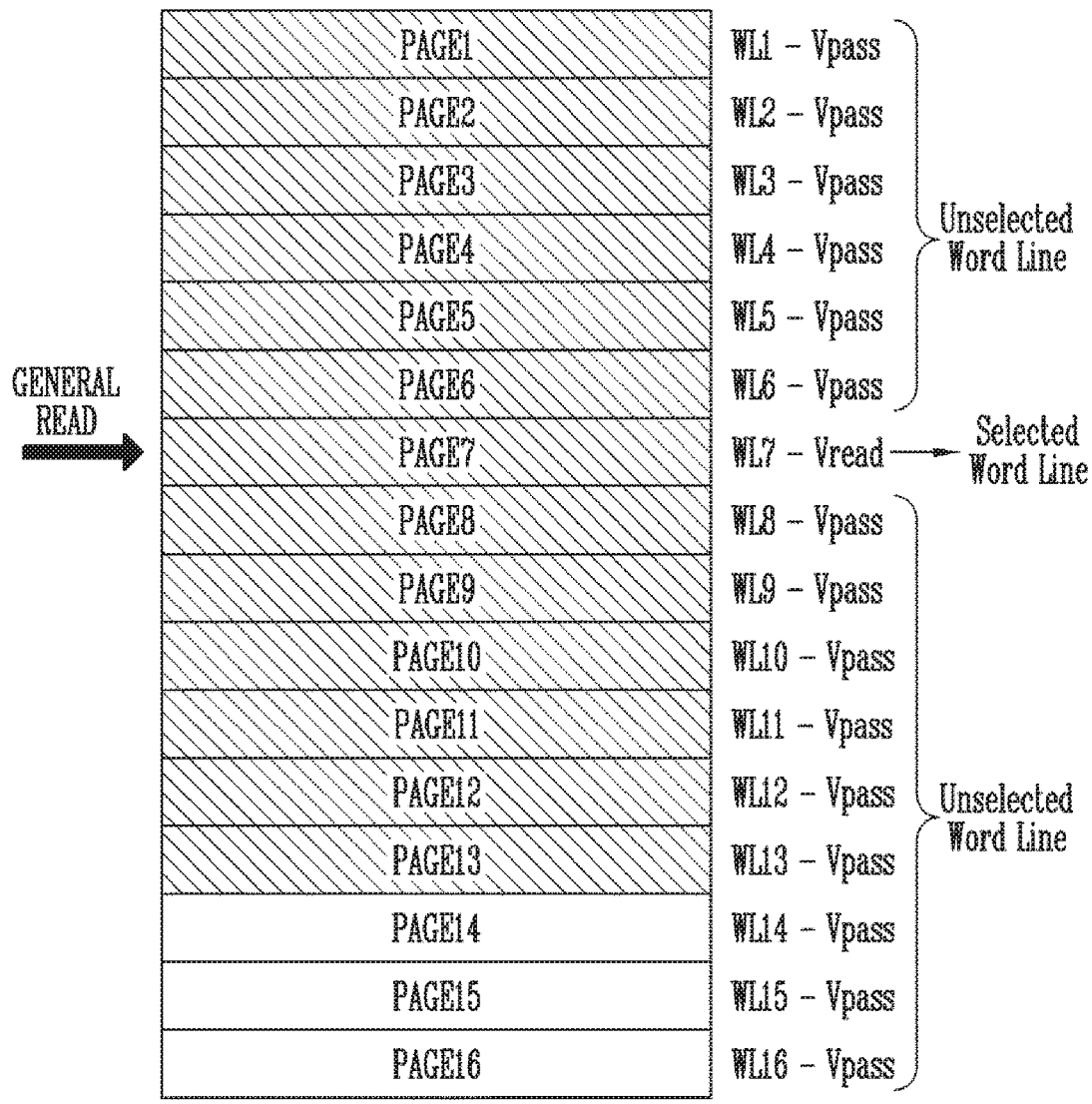
FIG. 14 is a diagram illustrating a general read operation.

FIG. 14 is a diagram illustrating a general read operation different from a search read operation. By way of example, FIG. 14 illustrates operations of the semiconductor memory device 100 when the controller 200 transfers a read command to perform a general read operation on the seventh page PAGE7. The read command may be the general operation command CMD_NMR shown in FIG. 7.

Referring to FIG. 14, in response to the read command for the seventh page PAGE7, the semiconductor memory device 100 may apply the pass voltage Vpass to the first to sixth word lines WL1 to WL6 and the eighth to sixteenth word lines WL8 to WL16, and may apply the read voltage Vread to the seventh word line WL7. On the basis of the seventh word line WL7, the pass voltage Vpass may be applied to the preceding word lines (WL1 to WL6) and the read voltage Vread may be applied to the seventh word line WL7, which may be the same as the search read operation. However, in the search read operation, the read voltage Vread may be applied to the subsequent word lines WL8 to WL16, whereas in the general read operation, the pass voltage Vpass may be applied thereto.

Figure 15:
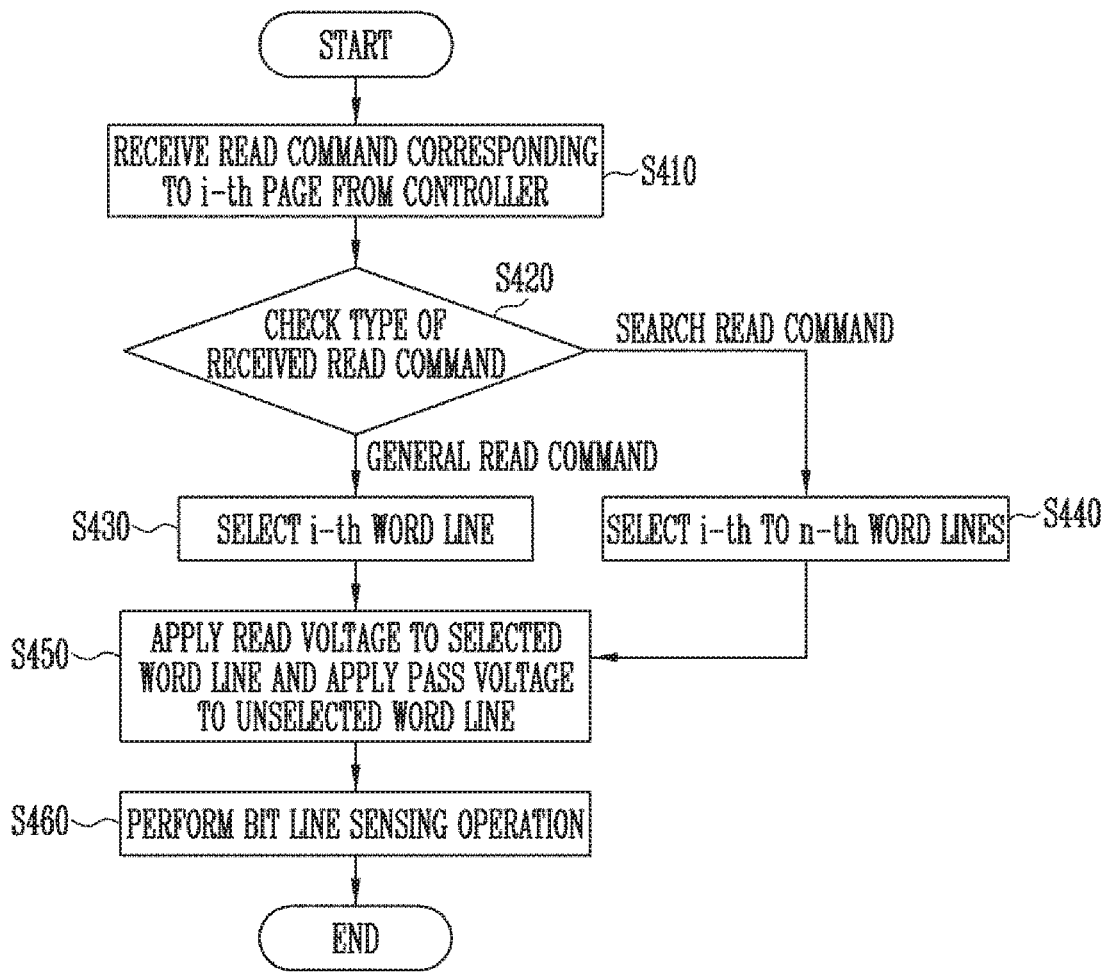
FIG. 15 is a flowchart illustrating a method of operating a semiconductor memory device according to an embodiment of the present disclosure.

FIG. 15 is a flowchart illustrating a method of operating a semiconductor memory device according to an embodiment of the present disclosure, for example, the semiconductor memory device 100 of FIG. 2.

Referring to FIG. 15, the semiconductor memory device 100 may receive a read command corresponding to the i-th page from the controller 200 (S410). The read command may be transferred to the control logic 140 of FIG. 2. The control logic 140 may check a type of the received read command (S420). In the present disclosure, the controller 200 may transfer one of the general operation command CMD_NMR and the search read command CMD_SR to the semiconductor memory device 100. Since the general operation command CMD_NMR includes general program, read and erase commands, the control logic 140 may determine whether the received read command is the search read command CMD_SR, or a read command included in the general operation command CMD_NMR.

When it is determined that the received command is a general read command, the process proceeds to step S430 to select the i-th word line. Therefore, as shown in FIG. 14, only the i-th word line corresponding to the i-th page may be selected, and the remaining word lines may not be selected.

When it is determined that the received command is a search read command, the process proceeds to step S440 to select the i-th to n-th word lines. Therefore, as shown in FIGS. 12A to 12D or FIGS. 13A to 13D, the i-th to n-th word lines corresponding to the i-th to n-th pages may be selected, and the first to (i−1)-th word lines may not be selected.

At step S450, a read voltage Vread may be applied to the selected word line, and a pass voltage Vpass may be applied to the unselected word lines. When the received command is a general read command, the read voltage Vread may be applied to the i-th word line and the pass voltage Vpass may be applied to the remaining word lines. When the received command is a search read command, a read voltage Vread may be applied to the i-th to n-th word lines, and a pass voltage Vpass may be applied to the first to (i−1)-th word lines.

At step S460, a bit line sensing operation may be performed. Thus, read data according to a bit line sensing result may be generated. When the received command is a general read command, read data may be stored in the i-th page. When the received data is a search read command, the read data may be search read data indicating whether the first to n-th pages are erased or not.

Though not shown in FIG. 15, according to an embodiment of the present disclosure, the method of operating the semiconductor memory device 100 may further include transferring the generated read data to the controller 200.

Figure 16:
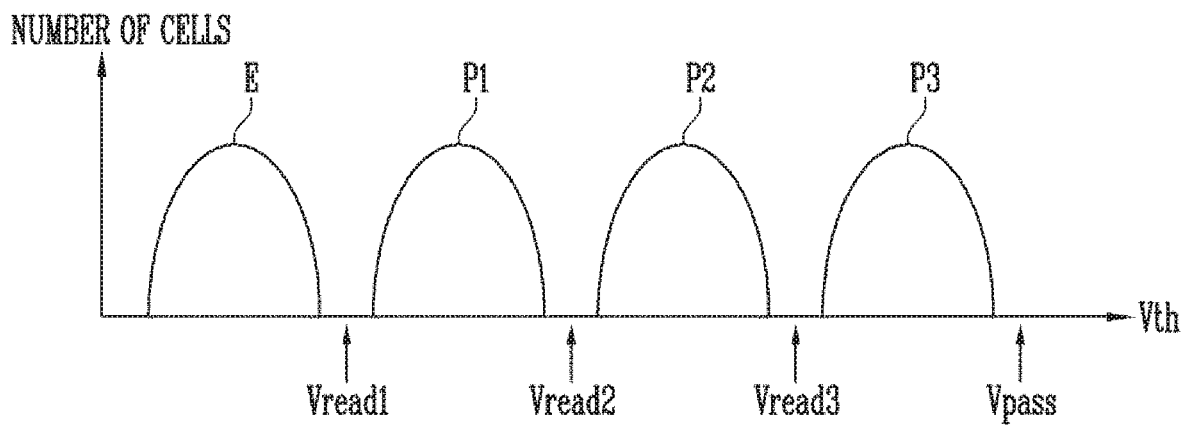
FIG. 16 is a diagram illustrating a threshold voltage distribution of multi-level cells (MLCs)

FIG. 16 is a diagram illustrating a threshold voltage distribution of multi-level cells (MLCs). The controller 200, the semiconductor memory device 100, the storage device 1000 having the same, and the operations thereof are described above on the basis of the single-level cell (SLC) shown in FIG. 8. However, the present disclosure is not limited thereto. As shown in FIG. 16, each of the threshold voltages of the multi-level cells (MLCs) may correspond to one of the four states (E, P1, P2, and P3) divided by first to third read voltages Vread1 to Vread3. During a search read operation on the multi-level cells, a read voltage Vread may be applied to word lines coupled to a search target page and subsequent pages and the pass voltage Vpass may be applied to word lines coupled to preceding pages. The read voltage Vread applied to the search target page and the subsequent pages may be one of the first to third read voltages Vread1 to Vread3. According to an embodiment, the read voltage Vread applied to the search target page and the subsequent pages may be the first read voltage Vread1. When the first read voltage Vread1 is used as a read voltage applied during a search read operation, search read data may be generated by dividing the erase state E from program states P1 to P3.

Though not shown in FIGS. 8 and 16, the search read operation of the present disclosure is applicable to a semiconductor memory device including a triple-level cell (TLC) storing 3-bit data or a quad-level cell (QLC) storing 4-bit data. In addition, the search read operation of the present disclosure is also applicable to a semiconductor memory device including memory cells storing five or more bits of data.

Figure 17:
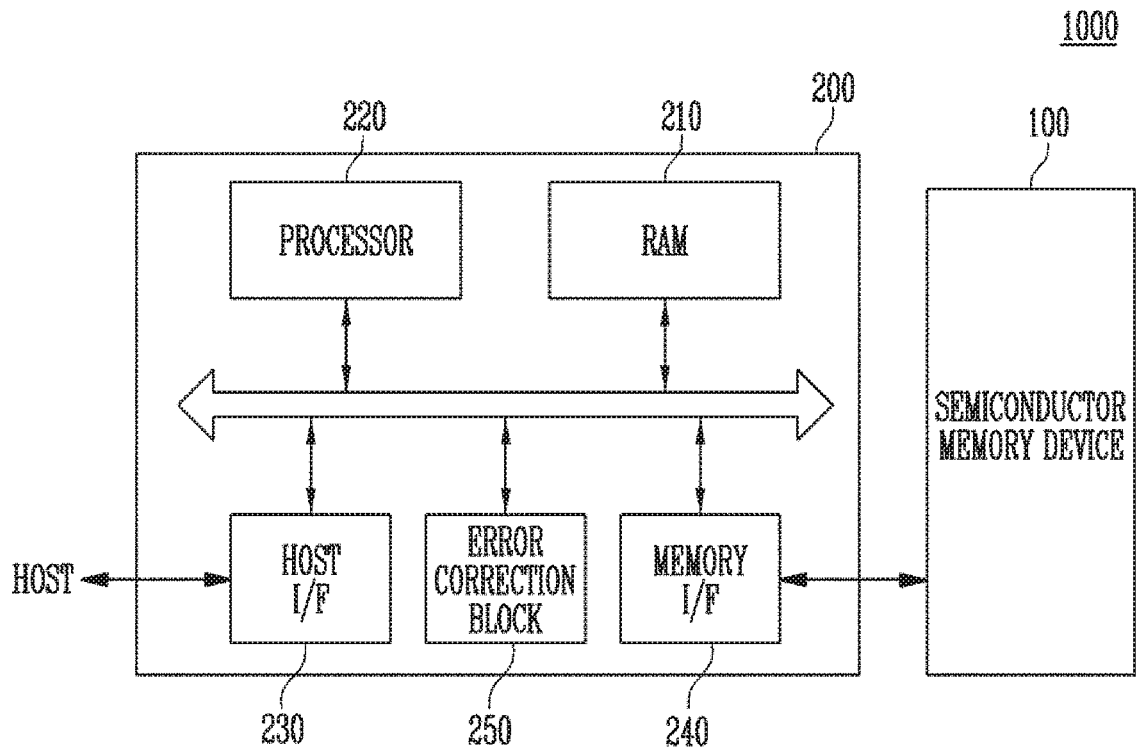
FIG. 17 is a block diagram illustrating an example of a controller shown in FIG. 7.

FIG. 17 is a block diagram illustrating an example of the controller 200 shown in FIG. 7.

Referring to FIG. 17, the controller 200 may be coupled between the semiconductor memory device 100 and a host. The semiconductor memory device 100 may be the semiconductor memory device described with reference to FIG. 2. The controller 200 may correspond to the controller 200 of FIG. 1 or FIG. 7. Hereinafter, repetitive explanations will be omitted.

The controller 200 may be configured to access the semiconductor memory device 100 at the request of a host (e.g., the host 300 of FIG. 1). For example, the controller 200 may control a read operation, a program operation, an erase operation, and/or a background operation of the semiconductor memory device 100. The controller 200 may be configured to provide an interface between the semiconductor memory device 100 and the host 300. The controller 200 may be configured to drive firmware for controlling the semiconductor memory device 100.

The controller 200 may include a random access memory (RAM) 210, a processor 220, a host interface 230, a memory interface 240, and an error correction block 250. The RAM 210 may be used as at least one of an operation memory of the processor 220, a cache memory between the semiconductor memory device 100 and the host 300, and a buffer memory between the semiconductor memory device 100 and the host 300. In addition, the RAM 210 may serve as a command queue for temporarily storing commands to be transferred to the semiconductor memory device 100.

The processor 220 may control the general operation of the controller 200. For example, the general operation controller 215, the erased page search controller 235, and the command generator 255 as shown in FIG. 7 may be provided in the form of firmware executed by the processor 220.

The host interface 230 may include a protocol for exchanging data between the host and the controller 200. For example, the controller 200 may communicate with the host through one or more various protocols such as a universal serial bus (USB) protocol, a multimedia card (MMC) protocol, a peripheral component interconnection (PCI) protocol, a PCI-express (PCI-e or PCIe) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, etc. According to an embodiment, the general operation controller 275 of FIG. 7 may be embodied into the host interface 230 of FIG. 17.

The memory interface 240 may interface with the semiconductor memory device 100. For example, the memory interface includes a NAND interface or a NOR interface. According to an embodiment, the data receiver 275 of FIG. 7 may be embodied into the memory interface 240 of FIG. 17.

The error correction block 250 may detect and correct errors in data read from the semiconductor memory device 100 by using an error correction code (ECC). The processor 220 may control a read voltage according to an error detection result of the error correction block 250 and control the semiconductor memory device 100 to perform re-read.

The controller 200 and the semiconductor memory device 100 may be integrated into a single semiconductor device. In an exemplary embodiment, the controller 200 and the semiconductor memory device 100 may be integrated into one semiconductor device to constitute a memory card. For example, the controller 200 and the semiconductor memory device 100 may be integrated into a single semiconductor device and form a memory card such as a personal computer memory card international association (PCMCIA), a compact flash card (CF), a smart media card (e.g., SM or SMC), a memory stick multimedia card (e.g., MMC, RS-MMC, or MMCmicro), a secure digital (SD) card (e.g., SD, miniSD, microSD, or SDHC), a universal flash storage (UFS), and the like.

The controller 200 and the semiconductor memory device 100 may be integrated into a single semiconductor device to form a solid state drive (SSD). The SSD may include a storage device for storing data in a semiconductor memory. When the storage device 1000 including the controller 200 and the semiconductor memory device 100 serves as a solid state drive (SSD), an operational speed of the host coupled to the storage device 1000 may be significantly improved.

In another example, the storage device including the controller 200 and the semiconductor memory device 100 may be provided as one of various elements of an electronic device such as a computer, a ultra-mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture player, a digital picture recorder, a digital video recorder, a device capable of transmitting/receiving information in an wireless environment, one of various devices for forming a home network, one of various electronic devices for forming a computer network, one of various electronic devices for forming a telematics network, an RFID device, or one of various elements for forming a computing system, or the like.

In an exemplary embodiment, the semiconductor memory device 100 or the storage device having the same may be embedded in packages in various forms. For example, the semiconductor memory device 100 or the storage device may be embedded in packages such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline integrated circuit (SOIC), a shrink small outline package (SSOP), a thin small outline (TSOP), a thin quad flatpack (TQFP), a system in package (SIP), a multichip package (MCP), a wafer-level fabricated package (WFP), a wafer-level processed stack package (WSP), or the like.

Figure 18:
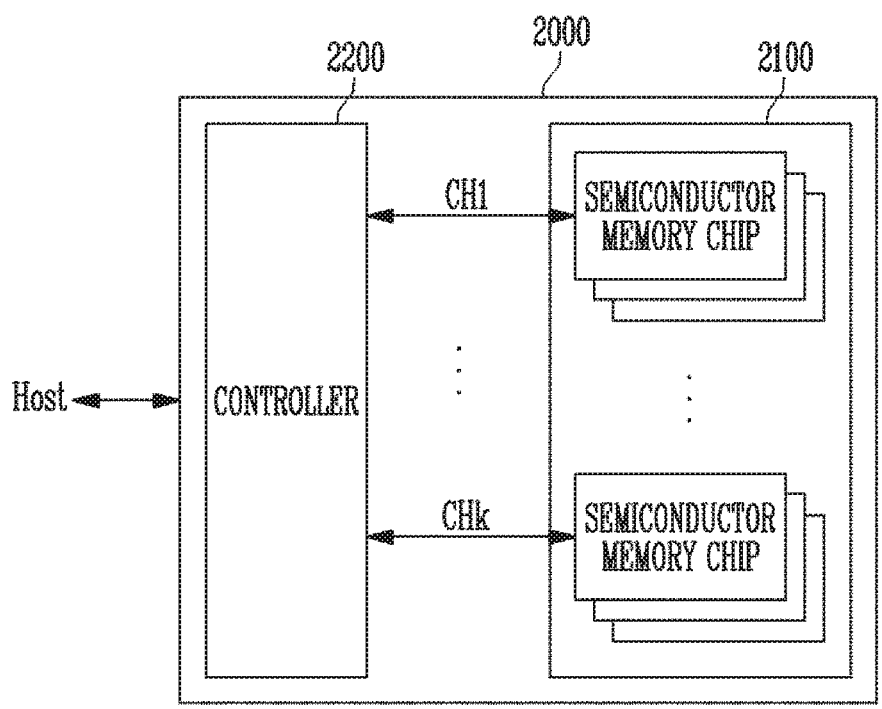
FIG. 18 is a block diagram illustrating an application example of a storage device of FIG. 1.

FIG. 18 is a block diagram illustrating a storage device 2000 corresponding to an application example of the storage device 1000 of FIG. 1.

Referring to FIG. 18, the storage device 2000 may include a semiconductor memory device 2100 and a controller 2200. The semiconductor memory device 2100 may include a plurality of semiconductor memory chips. The plurality of semiconductor memory chips may be divided into a plurality of groups.

In FIG. 18, it is illustrated that the plurality of groups communicate with the controller 2200 through first to k-th channels CH1 to CHk. Each of the semiconductor memory chips may be configured and operated in the same manner as the semiconductor memory device 100 described above with reference to FIG. 2.

Each group may be configured to communicate with the controller 2200 through a single common channel. The controller 2200 may be configured in substantially the same manner as the controller 200 described with reference to FIG. 18, and configured to control the plurality of memory chips of the semiconductor memory device 2100 through the plurality of first to k-th channels CH1 to CHk.

Figure 19:
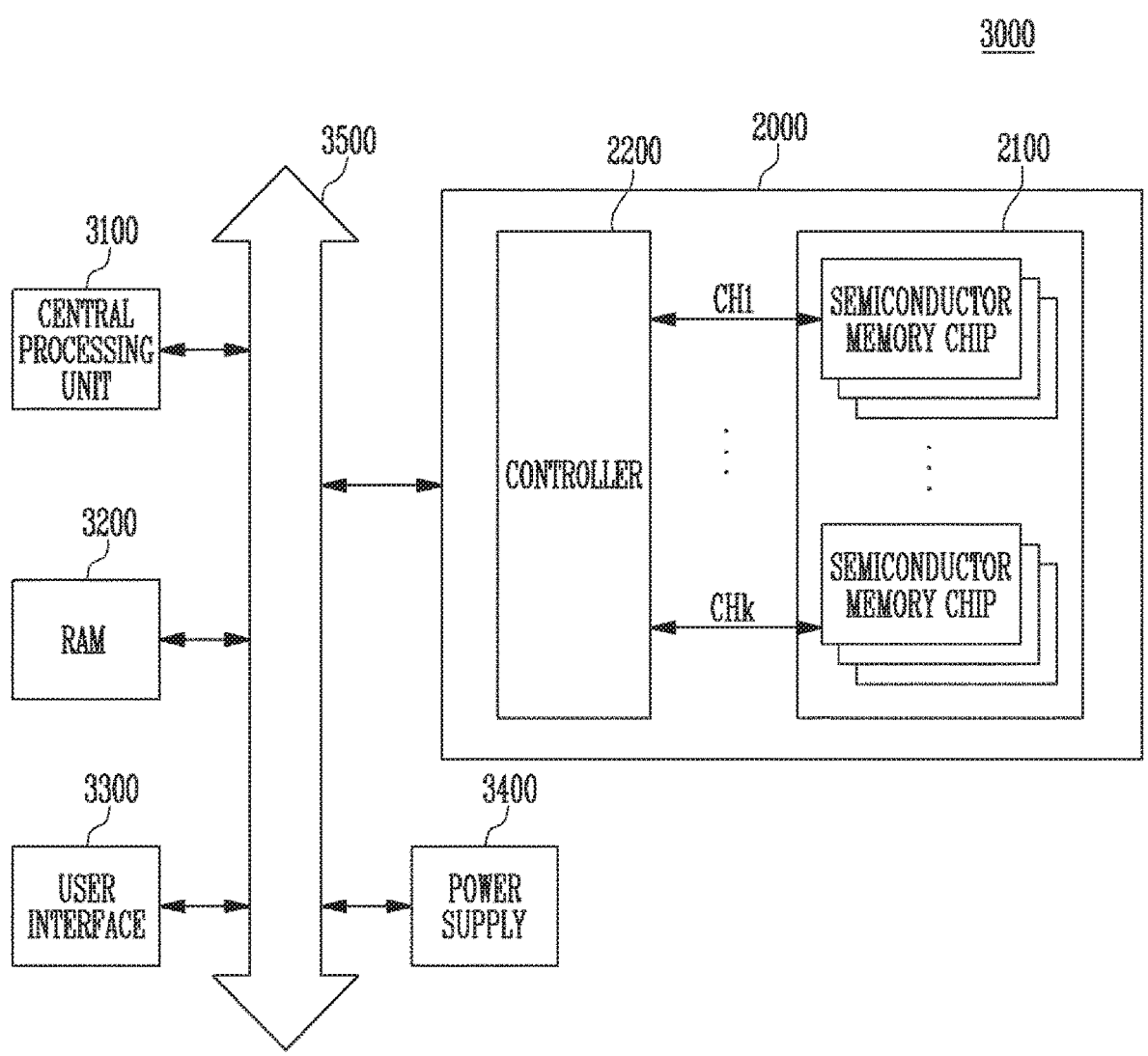
FIG. 19 is a block diagram illustrating a computing system including a storage device of FIG. 18.

FIG. 19 is a block diagram illustrating a computing system 3000 including the storage device 2000 described with reference to FIG. 18.

Referring to FIG. 19, the computing system 3000 may include a central processing unit 3100, a random access memory (RAM) 3200, a user interface 3300, a power supply 3400, a system bus 3500, and the storage device 2000.

The storage device 2000 may be electrically coupled to the central processing unit 3100, the RAM 3200, the user interface 3300 and the power supply 3400 through the system bus 3500. Data provided through the user interface 3300 or processed by the central processing unit 3100 may be stored in the storage device 2000.

FIG. 19 illustrates that the semiconductor memory device 2100 is coupled to the system bus 3500 through the controller 2200. However, the semiconductor memory device 2100 may be directly coupled to the system bus 3500. The functions of the controller 2200 may be performed by the central processing unit 3100 and the RAM 3200.

In FIG. 19, it is illustrated that the storage device 2000 described with reference to FIG. 18 is provided. However, the storage device 2000 may be replaced by the storage device 1000 including the controller 200 and the semiconductor memory device 100 as described above with reference to FIG. 17.

According to embodiments of the present disclosure, a semiconductor memory device capable of avoiding performance degradation caused by read disturb, a controller and a storage device having the same may be provided.

According to another embodiment of the present disclosure, a semiconductor memory device capable of avoiding performance degradation caused by read disturb and a method of operating a controller may be provided.

In the above-discussed embodiments, all steps may be selectively performed or skipped. In addition, the steps in each embodiment may not always be performed in regular order. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure. It will be apparent to those skilled in the art that various modifications can be made to the above-described exemplary embodiments of the present disclosure without departing from the spirit or scope of the invention. Thus, it is intended that the present disclosure cover all such modifications provided they come within the scope of the appended claims and their equivalents.

What is claimed is:

1. A controller controlling an operation of a semiconductor memory device, comprising:
    an erased page search controller determining a search mode of the semiconductor memory device, selecting a page to search for, among a plurality of pages, based on the search mode, and generating a search control signal corresponding to a selected page;
    a command generator generating a search read command for the selected page based on the search control signal; and
    a data receiver receiving, from the semiconductor memory device, search read data corresponding to the search read command,
    wherein the controller is configured to control, using the search read command, the semiconductor memory device to apply a read voltage to at least two word lines including a word line corresponding to the selected page, and to apply a pass voltage greater than the read voltage to remaining word lines other than the at least two word lines.

2. The controller of claim 1, wherein the data receiver transfers the search read data to the erased page search controller, and
    wherein the erased page search controller determines whether the selected page is an initially erased page on the basis of the search read data.

3. The controller of claim 2, wherein the initially erased page is an erased page that serves as a boundary between a program state and an erase state among a plurality of pages in a selected memory block.

4. The controller of claim 3, wherein the erased page search controller changes the page to search for and generates a search control signal corresponding to the changed page when the selected page is not the initially erased page.

5. The controller of claim 4, wherein the erased page search controller changes the page to search for by a binary search method or a linear search method.

6. The controller of claim 1, further comprising a general operation controller receiving a request from a host and generating a general control signal corresponding to the request,
    wherein the command generator generates a general operation command to control a general operation of the semiconductor memory device based on the general control signal.

7. A semiconductor memory device, comprising:
    a memory cell array including a plurality of memory blocks;
    a peripheral circuit performing a search read operation on the memory cell array; and
    a control logic controlling the peripheral circuit to perform the search read operation on a selected memory block of the memory cell array in response to a search read command received from a controller,
    wherein during the search read operation, the peripheral circuit applies a read voltage to at least two word lines, among a plurality of word lines coupled to the selected memory block, and applies a pass voltage greater than the read voltage to remaining word lines among the plurality of word lines.

8. The semiconductor memory device of claim 7, wherein the selected memory block includes first to n-th pages, and
    the first to n-th pages are programmed starting from the first page, and pages with smaller numbers are programmed before pages with larger numbers,
    where n is a natural number greater than one.

9. The semiconductor memory device of claim 7, wherein when the control logic receives the search read command for an i-th page, the control logic controls the peripheral circuit to perform a read operation by applying the pass voltage to word lines coupled to first to (i−1)-th pages and applying the read voltage to word lines coupled to the i-th to n-th pages,
    where i is a natural number greater than one and equal to or less than n.

10. The semiconductor memory device of claim 7, wherein the control logic controls the peripheral circuit to perform a general read operation on the memory cell array in response to receiving a general read command, and
    wherein during the general read operation, the peripheral circuit performs a read operation by applying the read voltage to a selected word line, among the plurality of word lines coupled to the selected memory block, and applying the pass voltage to unselected word lines among the plurality of word lines.

11. The semiconductor memory device of claim 10, wherein the selected memory block includes first to n-th pages, and
    wherein when the control logic receives the general read command for an i-th page, the control logic controls the peripheral circuit to perform the read operation by applying the pass voltage to word lines coupled to first to (i−1)-th pages and (i+1)-th to n-th pages and applying the read voltage to a word line coupled to the i-th page,
    where n is a natural number greater than one, and i is a natural number greater than one and equal to or less than n.

12. A storage device, comprising:
    a semiconductor memory device including a plurality of memory blocks; and
    a controller controlling an operation of the semiconductor memory device,
    wherein the controller transfers a search read command corresponding to a first selected page in a selected memory block, among the plurality of memory blocks, to the semiconductor memory device, in response to a search mode, and
    wherein, in response to the search read command, the semiconductor memory device applies a read voltage to at least two word lines, including a word line corresponding to the first selected page, among a plurality of word lines coupled to the selected memory block, and applies a pass voltage greater than the read voltage to remaining word lines other than the at least two word lines.

13. The storage device of claim 12, wherein the semiconductor memory device transfers search read data corresponding to a result of the search read operation to the controller, and wherein the controller determines whether the first selected page is an initially erased page based on the search read data.

14. The storage device of claim 13, wherein the controller transfers a search read command corresponding to a second selected page in the selected memory block to the semiconductor memory device when it is determined that the first selected page is not the initially erased page.

15. The storage device of claim 14, wherein the controller determines the first selected page and the second selected page by a binary search method.

16. The storage device of claim 14, wherein the controller determines the first selected page and the second selected page by a linear search method.

17. A method of operating a controller controlling an operation of a semiconductor memory device, the method comprising:
   determining a search mode of the semiconductor memory device; and
   searching for an initially erased page for a selected memory block of the semiconductor memory device by using a search read command,
   wherein, in response to the search read command, the semiconductor memory device applies a read voltage to at least two word lines including a word line corresponding to a selected page, and applies a pass voltage greater than the read voltage to remaining word lines other than the at least two word lines.

18. The method of claim 17, wherein the searching for the initially erased page comprises:
   transferring a search read command corresponding to the selected page, among a plurality of pages in the selected memory block, to the semiconductor memory device;
   receiving search read data corresponding to the search read command from the semiconductor memory device; and
   determining whether the selected page and subsequent pages are erased pages on the basis of the search read data.

19. The method of claim 18, wherein the determining of whether the selected page and the subsequent pages are the erased pages on the basis of the search read data comprises determining the selected page and the subsequent pages as the erased pages when the search read data indicates data corresponding to an erase state.

20. The method of claim 18, wherein the determining of whether the selected page and the subsequent pages are the erased pages on the basis of the search read data comprises determining at least one of the selected page and the subsequent pages as a programmed page when the search read data includes data corresponding to a program state.

* * * * *